(12) United States Patent
Seal et al.

(10) Patent No.: US 10,720,380 B1
(45) Date of Patent: Jul. 21, 2020

(54) FLIP-CHIP WIRE BONDLESS POWER DEVICE

(71) Applicants: Starlet R. Glover, Farmington, AR (US); Sayan Seal, Fayetteville, AR (US); H. Alan Mantooth, Fayetteville, AR (US)

(72) Inventors: Sayan Seal, Fayetteville, AR (US); Michael D. Glover, Fayetteville, AR (US); H. Alan Mantooth, Fayetteville, AR (US)

( * ) Notice: Subject to any disclaimer, the term of this patent is extended or adjusted under 35 U.S.C. 154(b) by 0 days.

(21) Appl. No.: 16/007,463

(22) Filed: Jun. 13, 2018

Related U.S. Application Data

(60) Provisional application No. 62/518,792, filed on Jun. 13, 2017.

(51) Int. Cl.
  *H01L 23/12* (2006.01)
  *H01L 23/495* (2006.01)
  *H01L 23/00* (2006.01)

(52) U.S. Cl.
  CPC .... *H01L 23/4952* (2013.01); *H01L 23/49568* (2013.01); *H01L 24/03* (2013.01); *H01L 24/05* (2013.01); *H01L 24/06* (2013.01); *H01L 24/11* (2013.01); *H01L 24/16* (2013.01); *H01L 24/29* (2013.01); *H01L 24/32* (2013.01); *H01L 24/73* (2013.01); *H01L 24/92* (2013.01); *H01L 2224/0381* (2013.01); *H01L 2224/03825* (2013.01); *H01L 2224/0401* (2013.01); *H01L 2224/04026* (2013.01); *H01L 2224/05083* (2013.01); *H01L 2224/05118* (2013.01); *H01L 2224/05124* (2013.01); *H01L 2224/05155* (2013.01); *H01L 2224/05644* (2013.01); *H01L 2224/06181* (2013.01); *H01L 2224/1132* (2013.01); *H01L 2224/16221* (2013.01); *H01L 2224/29139* (2013.01); *H01L 2224/32245* (2013.01); *H01L 2224/73253* (2013.01); *H01L 2224/9202* (2013.01); *H01L 2224/92242* (2013.01); *H01L 2924/10272* (2013.01);
  (Continued)

(58) Field of Classification Search
  None
  See application file for complete search history.

(56) References Cited

U.S. PATENT DOCUMENTS

| | | | |
|---|---|---|---|
| 4,891,686 A | 1/1990 | Krausse, III | 357/68 |
| 5,514,604 A | 5/1996 | Brown | 437/40 |

(Continued)

*Primary Examiner* — Ali Naraghi
(74) *Attorney, Agent, or Firm* — Keisling & Pieper PLC; Daniel B. Pieper

(57) ABSTRACT

A flip-chip wire bondless power device and method for using a two sided contact bare die power device as a single-connection-level power device. The device uses a top pad solder ball array for connecting a top pad electrically connected to the top contact of the bare die power device and a bottom pad solder ball array for connecting a bottom pad that is electrically through an electrically conductive bottom pad connector that is electrically connected to the bottom contact of the bare die power device using an electrically conductive die-attach material, the top pad and bottom pad, and thereby the top pad solder ball array and the bottom pad solder ball array are planar for flip chip mounting. A trench can be formed between the top pad and bottom pad for isolation and insulation purposes. A method of assembling a flip-chip wire bondless power device is also provided.

5 Claims, 29 Drawing Sheets

(52) U.S. Cl.
CPC .............. *H01L 2924/13055* (2013.01); *H01L 2924/13091* (2013.01)

(56) References Cited

U.S. PATENT DOCUMENTS

| | | | |
|---|---|---|---|
| 5,604,377 A | 2/1997 | Palagonia | 257/685 |
| 5,665,996 A | 9/1997 | Williams et al. | 257/401 |
| 5,767,567 A | 6/1998 | Hu et al. | 257/666 |
| 6,249,041 B1 | 6/2001 | Kasem et al. | 257/666 |
| 6,307,755 B1 | 10/2001 | Williams et al. | 361/813 |
| 6,333,551 B1 * | 12/2001 | Caletka | H01L 23/3737 257/706 |
| 6,747,350 B1 * | 6/2004 | Lin | H01L 23/3128 257/704 |
| 6,793,502 B2 | 9/2004 | Parkhill et al. | 439/66 |
| 6,930,385 B2 | 8/2005 | Hsu et al. | 257/714 |
| 7,057,273 B2 | 6/2006 | Harnden et al. | 257/696 |
| 7,215,012 B2 | 5/2007 | Harnden et al. | 257/676 |
| 7,232,710 B2 | 6/2007 | Hsu et al. | 438/122 |
| 7,332,757 B2 | 2/2008 | Kajiwara et al. | 257/288 |
| 7,394,150 B2 | 7/2008 | Kasem et al. | 257/690 |
| 7,449,370 B2 | 11/2008 | Tanaka | 438/123 |
| 7,485,954 B2 | 2/2009 | Havanur | 257/686 |
| 7,687,903 B2 | 3/2010 | Son et al. | 257/723 |
| 8,018,056 B2 | 9/2011 | Hauenstein | 257/730 |
| 8,368,210 B2 | 2/2013 | Hauenstein | 257/724 |
| 8,564,114 B1 * | 10/2013 | Lanzone | H01L 23/3128 257/276 |
| 9,275,938 B1 | 3/2016 | McPherson et al. | 23/495 |
| 9,368,537 B1 | 6/2016 | Holmes et al. | 27/146.36 |
| 9,728,868 B1 | 8/2017 | Lostetter | 12/52 |
| 2009/0115052 A1 * | 5/2009 | Treece | H01L 21/8258 257/706 |
| 2014/0070397 A1 * | 3/2014 | Viswanathan | H01L 23/5389 257/706 |
| 2016/0247748 A1 * | 8/2016 | Kinzer | H01L 23/49568 |
| 2018/0277490 A1 * | 9/2018 | Yoon | H01L 23/3121 |

* cited by examiner

FLIP-CHIP WIRE BONDLESS POWER DEVICE

CROSS-REFERENCE TO RELATED APPLICATIONS

This application claims priority to and is a continuation-in-part of U.S. Provisional Application Ser. No. 62/518,792 filed on Jun. 13, 2017. This prior application is incorporated by reference in its entirety.

STATEMENT REGARDING FEDERALLY SPONSORED RESEARCH OR DEVELOPMENT

This invention was made with government support by the National Science Foundation Engineering Research Center for Power Optimization of Electro Thermal Systems (PO-ETS) with cooperative agreement EEC-1449548. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to semiconductor devices and, in particular, to converting bare die to flip-chip wire bondless power devices and methods of assembly.

2. Description of the Known Art

As will be appreciated by those skilled in the art, power devices are known in various forms.

Patents disclosing information relevant to wire bonding and/or power packages include: U.S. Pat. No. 9,728,868, issued to Lostetter on Aug. 8, 2017 entitled Apparatus having self healing liquid phase power connects and method thereof; U.S. Pat. No. 9,368,537, issued to Holmes, et al. on Jun. 14, 2016 entitled Integrated silicon carbide ultraviolet sensors and methods; U.S. Pat. No. 9,275,938, issued to McPherson, et al. on Mar. 1, 2016 entitled Low profile high temperature double sided flip chip power packaging; U.S. Pat. No. 8,368,210 issued to Hauenstein on Feb. 5, 2013 entitled Wafer scale package for high power devices; U.S. Pat. No. 8,018,056 issued to Hauenstein on Sep. 13, 2011 entitled Package for high power density devices; U.S. Pat. No. 7,786,486 issued to Casey, et al. on Aug. 31, 2010 entitled Double-sided package for power module; U.S. Pat. No. 7,687,903, issued to Son, et al. on Mar. 30, 2010 entitled Power module and method of fabricating the same; U.S. Pat. No. 7,485,954, entitled Havanur on Feb. 3, 2009 entitled Stacked dual MOSFET package; U.S. Pat. No. 7,449,370, issued to Tanaka on Nov. 11, 2008, entitled Production process for manufacturing such semiconductor package; U.S. Pat. No. 7,394,150, issued to Kasem, et al. on Jul. 1, 2008 entitled Semiconductor package including die interposed between cup-shaped lead frame and lead frame having mesas and valleys; U.S. Pat. No. 7,332,757, issued to Kajiwara, et al. on Feb. 19, 2008 entitled MOSFET package; U.S. Pat. No. 7,232,710, issued to Hsu, et al. on Jun. 19, 2007 entitled Method of making cascaded die mountings with springs-loaded contact-bond options; U.S. Pat. No. 7,215,012, issued to Harnden, et al. on May 8, 2007 entitled Space-efficient package for laterally conducting device; U.S. Pat. No. 7,057,273, issued to Harnden, et al. on Jun. 6, 2006 entitled Surface mount package; U.S. Pat. No. 6,930,385, issued to Hsu, et al. on Aug. 16, 2005 entitled Cascaded die mountings with spring-loaded contact-bond options; U.S. Pat. No. 6,793,502, issued to Parkhill, et al. on Sep. 21, 2004 entitled Press (non-soldered) contacts for high current electrical connections in power modules; U.S. Pat. No. 6,307,755 issued to Williams, et al. on Oct. 23, 2001 entitled Surface mount semiconductor package, die-leadframe combination and leadframe therefore and method of mounting leadframes to surfaces of semiconductor die; U.S. Pat. No. 6,249,041, issued to Kasem, et al. on Jun. 19, 2001 entitled IC chip package with directly connected leads; U.S. Pat. No. 5,767,567, issued to Hu, et al. on Jun. 16, 1998 entitled Design of device layout for integration with power mosfet packaging to achieve better lead wire connections and lower on resistance; U.S. Pat. No. 5,665,996, issued to Williams, et al. on Sep. 9, 1997 entitled Vertical power mosfet having thick metal layer to reduce distributed resistance; U.S. Pat. No. 5,604,377, issued to Palagonia on Feb. 18, 1997 entitled Semiconductor chip high density packaging; U.S. Pat. No. 4,891,686, issued to Krausse, III on Jan. 2, 1990 entitled Semiconductor packaging with ground plane conductor arrangement; and U.S. Pat. No. 5,514,604, issued to Brown on May 7, 1996 entitled Vertical channel silicon carbide metal-oxide-semiconductor field effect transistor with self-aligned gate for microwave and power applications, and method of making. Each of these patents is hereby expressly incorporated by reference in their entirety.

Wide band gap (WBG) semiconductor devices have captured the attention of the power electronics industry. Power systems employing WBG devices have been demonstrated to operate at high switching frequencies and high operating temperatures as compared with conventional silicon power modules. Silicon carbide, SiC, is the most prevalent WBG material in applications exceeding 600 V, while gallium nitride, GaN, devices are typically employed for applications in the relatively lower voltage range. Although the benefits of both material systems are well appreciated, there has been very little progress in pushing the envelope in terms of performance. One of the factors inhibiting progress is the dated packaging technology used in state-of-the-art, SOA, WBG device modules.

Silicon packaging technology underwent its share of evolution from TO-247 type discrete packages to modern day press-packs—with a range of packaging solutions tailored for specific needs. A case can be made that silicon packaging technology has advanced to a point where the performance of the device is limited by device physics, rather than the packaging. Unfortunately, this is far from true in case of WBG devices. The packaging technology used currently for WBG device modules is optimized to achieve the performance limit of silicon devices. In continuing to employ these outmoded methods, the power electronics field is deprived of the full gamut of benefits that WBG devices have to offer.

Despite the relative inferiority in electrical and thermal performance, silicon device modules have also benefited greatly from packaging innovations in the past. The literature is rife with examples of alternatives to conventional wire bonded interconnections. There are several disadvantages of wire bonded modules, but it continues to be the industry standard in power electronics. An overwhelmingly large percentage of power device bare die are tailored to lend themselves to a wire bonded manufacturing approach. The major disadvantages of wire bonds may be summarized as follows:

1. Wire bonds offer a large parasitic inductance in the signal paths. Silicon power devices cannot be switched at high frequencies—wire bonded modules show large overshoots even when they are switched at frequencies less than 10 kHz. This results in designers having to overrate their device choices, include snubbers and other protection measures, and account for high transient heat dissipation in their designs. The case is worse for high-power modules. It is understandable then, that wire bonding is not a viable option for SiC modules which have the potential to switch at frequencies of several MHz. Realizing high-frequency switching is an important step forward for power electronics. It will reduce the demand on the passive devices, including inductors and capacitors, required for the filtering circuitry. Physically smaller passive devices will greatly impact the overall power density of the system.

2. Wire bonds cannot support 3D packaging approaches. One of the most effective ways to boost power density and reduce signal path parasitic inductance is 3D integration. This approach has yielded benefits in many areas across the electronics industry. Wire bonding cannot be employed to realize these densely integrated architectures. Once a bare die is wire bonded, the scope for utilizing the top surface for connections in the vertical direction is eliminated.

3. Wire bonds cannot support double-sided cooling schemes. In high-current applications, an ultra-high switching frequency is not so much the focus, as is efficient heat removal. Overheating under current load causes premature module failure. One of the most efficient ways to manage an excessive thermal load is to distribute the thermal management of the module over two surfaces—the top and the bottom. This could cut the overall thermal resistance of the module into as much as half with proper material selection. This results in a two-fold advantage. On the one hand, it relieves the requirement of a voluminous heat sink. On the other hand, better thermal management will prevent the formation of localized hot-spots within the module—thus contributing to increased reliability.

4. Wire bonds are a reliability risk. Aluminum and copper are the most prevalent materials used for bond wires. There is a significant co-efficient of thermal expansion, CTE, mismatch between a semiconductor die and the metal wires. Power devices are subject to large transient thermal loads as a result of switching and conduction losses of the power device. In addition, the current through the bond wires themselves contribute to Joule heating. These processes exacerbate the CTE mismatch issue at the interface between the bond wire and semiconductor. Wire bond heel cracking is commonly observed as a failure mode in conventional wire bonded modules. Encapsulating wire bonds in silicones and epoxies alleviates the stress to an extent, but these potting compounds also degrade as they age under exposure to heat and humidity.

The silicon industry itself has been cognizant of these issues and has proposed several solutions over the years. The major GaN manufacturers have also innovated significantly by introducing flip-chip type packages for their devices. Although GaN devices are typically used for low voltage operations, they have made significant progress toward the "high frequency switching" goal in power electronics. It should be noted, however, that GaN devices are ideally suited for a flip-chip interconnection due to being lateral devices (i.e. they have all the electrical pads on the same surface). The same cannot be said for vertical SiC devices, with electrical contacts on either side of the die.

Accordingly, a need exists for improved wire bondless device packages and methods of assembly that addresses the deficiencies of existing packages.

SUMMARY OF THE INVENTION

This invention pertains to the development of a novel 3D module architecture for silicon carbide power devices. Thus far, silicon carbide devices are available for use in one of two forms—a standard footprint discrete module, like a TO-247 package, or in the form of wire bonded modules. These modules suffer from several major drawbacks, the modules have large parasitic inductances in the critical signal paths, the modules cannot be used to implement high density 3D architectures, the modules lack the provision for double sided cooling and there is a reliability risk. Wire bonded modules do offer a certain degree of customizability and novelty to improve performance, but they necessitate that the power electronics designer has access to a packaging facility. Furthermore, 3D architectures and double-sided cooling schemes are not realizable with wire bonded modules.

This invention offers a solution to all the above issues. In one embodiment, the package has a footprint measuring smaller than a TO-247 package. It combines the ease of-use of discrete devices with a performance that exceeds state-of-the-art wire bonded module technology. The low inductance paths achieved through this novel architecture enable MHz-level switching in SiC power topologies and consequently lead to unprecedented high-density designs. 3D topologies are also made possible, allowing novel ultra-low inductance vertical gate loops and power loops in SiC modules. In high current applications, where loop inductance is less of a concern as compared to heat generation, the proposed device structure can be used for double-sided cooling for more efficient heat removal. Lower electrical path inductances also have a beneficial impact on the electromagnetic interference generation at high switching frequencies.

Another major advantage of this invention is the scalability and cost of the proposed invention. The technology can be customized to fit bare die power devices from any manufacturer and can be tailored to the electrical requirements of a particular device. The concept was prototyped using economical materials like solder paste, solder spheres, and copper stock. For "high-performance" alternatives, the materials can be easily upgraded to options like sintered silver paste and metal-matrix composites, while maintaining the same efficient process flow.

The present disclosure relates to flip-chip wire bondless power devices and methods of assembly. Accordingly, in one embodiment of the present disclosure is a flip-chip wire bondless power package, the package comprising:

(a) a bare die power device;
(b) a top solder ball array applied to a top pad(s), wherein the top solder ball array is electrically connected to the bare die power device;

(c) an electrically conductive bottom pad connector, wherein the bottom pad connector is attached to the bare die power device using an electrically conductive die-attach material;
(d) a bottom solder ball array applied to a bottom pad, wherein the bottom solder ball array is electrically connected to the bottom pad connector In another embodiment of the present disclosure, there is included a method of assembling a flip-chip wire bondless power device package, the method comprising:
(a) preparing a bare die power device to have a solderable top contact;
(b) applying a top solder ball array to the top pad, wherein the top solder ball array is electrically connected to the top contact of the bare die power device;
(c) attaching a bare die power device to an electrically conductive bottom pad connector using an electrically conductive die-attach material;
(d) applying a bottom solder ball array to a bottom pad, wherein the bottom solder ball array is electrically connected to the bottom pad connector.

In another embodiment, the bare die power device is a silicon carbide device.

In another embodiment, the electrical contact pads of the bare die power device have been prepared with electroless plating.

In another embodiment, the top pad and bottom pad are disposed on the same side of the device.

In another embodiment, the device comprises a trench between the top pad and the bottom pad.

In another embodiment, a solder mask is applied to one or more of the top pad or bottom pad.

In another embodiment, the bottom pad connector is milled out of sheet metal.

In another embodiment, the bottom pad connector is milled out of molybdenum-copper.

In another embodiment, the bottom pad connector is milled out of aluminum silicon carbide.

In another embodiment, the bottom pad connector is milled out of molybdenum.

In another embodiment, the bottom pad connector is made of patterned direct bonded copper or aluminum substrate.

In another embodiment, the bottom pad connector is attached to the bare die power device using high-temperature solder or sintered silver.

In another embodiment, the bare die power device is a commercially available bare die power device.

In one embodiment of the present disclosure, the process of manufacture follows a five-step process compatible with standard industrial practice and lends itself very well to high volume manufacture. The proposed architecture converts a commercial-off-the-shelf, COTS, bare die power device into a minimalist flip-chip package. The reconfigured package leverages the full benefits that SiC technology has to offer, and does so using a simple and economical manufacturing process. It can be used as a direct replacement for discrete power devices and power modules and electrically outperforms both discrete packages as well as wire-bonded modules. The voltage overshoot and ringing observed in the flip-chip package was negligible as compared with the state-of-the-art.

There are no SiC device architectures or modules in the market that claims to achieve these goals. cost, customizability, and manufacturability are additional benefits of the invention. This invention unlocks the creative potential for novel silicon carbide circuit topologies to herald in the era of MHz switching and high-density power electronics. The devices and methods of the invention have applicability in a wide variety of products and services including automotive power electronics, power inverters, high ambient temperature environments, applications with large temperatures swings, applications requiring high power density, power converters with MHz-level switching frequency, and 3D power modules.

Other features and advantages of the present application will become apparent from the following detailed description. It should be understood, however, that the detailed description and specific examples, while indicating preferred embodiments, are given by way of illustration only. Various changes and modifications within the spirit and scope of the application will be apparent to those skilled in the art from the instant disclosure.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 12A is a schematic depicting a power loop and gate loop in a conventional lateral loop design.

DETAILED DESCRIPTION OF THE INVENTION

Figure 1A:
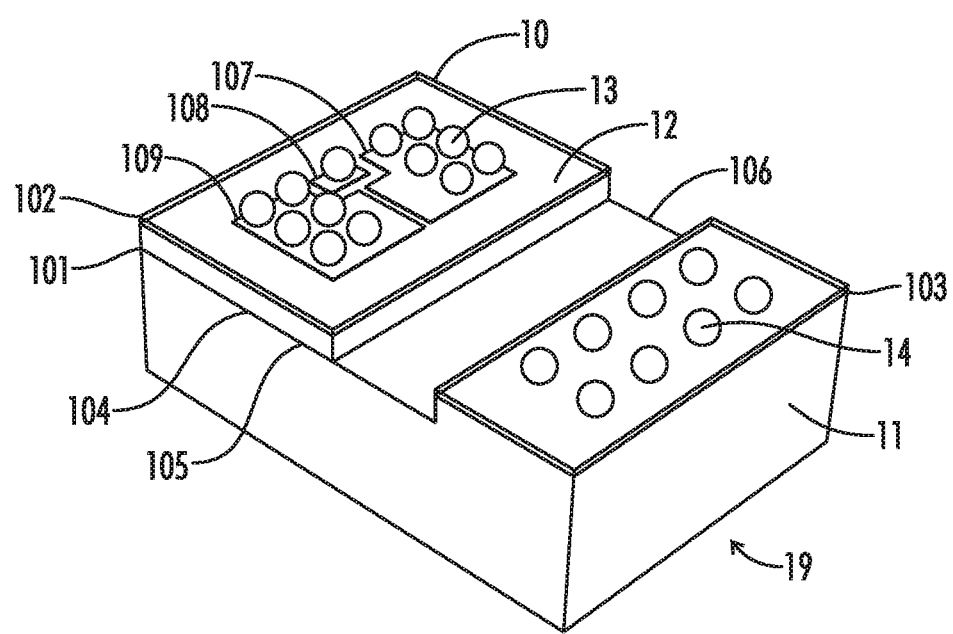
FIG. 1A is a schematic showing the flip-chip power device according to some embodiments.

As shown in FIG. 1A of the drawings, one exemplary embodiment of the present invention is generally shown as a bare die converted to flip-chip power device 19 according to one embodiment of the present invention. Flip-chip wire bondless power device packages and methods of assembly are described herein which may provide one or more advantages over prior devices. Packages and methods herein leverage advantages that SiC technology has to offer, and does so using an economical manufacturing process.

In a preferred embodiment, a power device in bare die form 10 is re-engineered into a flip-chip package through a series of steps. It is relatively simple to flip-chip bond a device with pads on the same side of the wafer. The situation is significantly more complicated for a silicon carbide power device which has electrical contacts on either side of the wafer. The method described herein provides a viable solution to this issue. FIG. 1A shows a schematic representation of the flip-chip power device 19. The bottom electrical contact 101 of the bare die power device 10 is routed to the top surface at the top surface second contact 103 using a machined and electrically conductive bottom pad connector 11. The die 10 is attached to this connector at the lower level pad 104 using an electrically conductive die-attach material 105. The clearance between the surfaces of the die 10 and the bottom connector 11 is determined by the maximum voltage rating of the bare die device 10. To further increase the creepage distance between these contacts, a trench 106 is milled between the two planar terminal surfaces 103, 107. As in the case of a MOSFET or IGBT, the gate pad 108 and source pads 109 are in very close proximity on the top surface 107 of the die 10. It is necessary to provide additional clearance between the pads to obtain a reliable flip-chip connection. Insufficient spatial clearance may result in the formation of conductive bridges between dissimilar pads leading to system failure. This is achieved by using a solder mask 12 applied to the surface of the package and patterning designated pads for solder ball 13, 14 attachment.

Solder ball arrays have been extensively used in the manufacturing of high-density, high-speed, and highly reliable electronics at low voltages in the past. This package and method leverages this advantage as it applies to power electronics. Multiple solder spheres on the same pad builds redundancy in the system, thus enhancing the reliability. Solder ball arrays are also self-planarizing and self-centering due to the property of surface tension of molten solder. This makes for a highly repeatable manufacturing and assembly process. Top pad solder spheres 13 and bottom pad solder spheres 14 are applied to the respective top and bottom pads. The solder ball array also enables short and low-inductance signal paths. Vertical interconnections are made possible with this device to form 3D stacked power electronics modules.

Figure 1B:
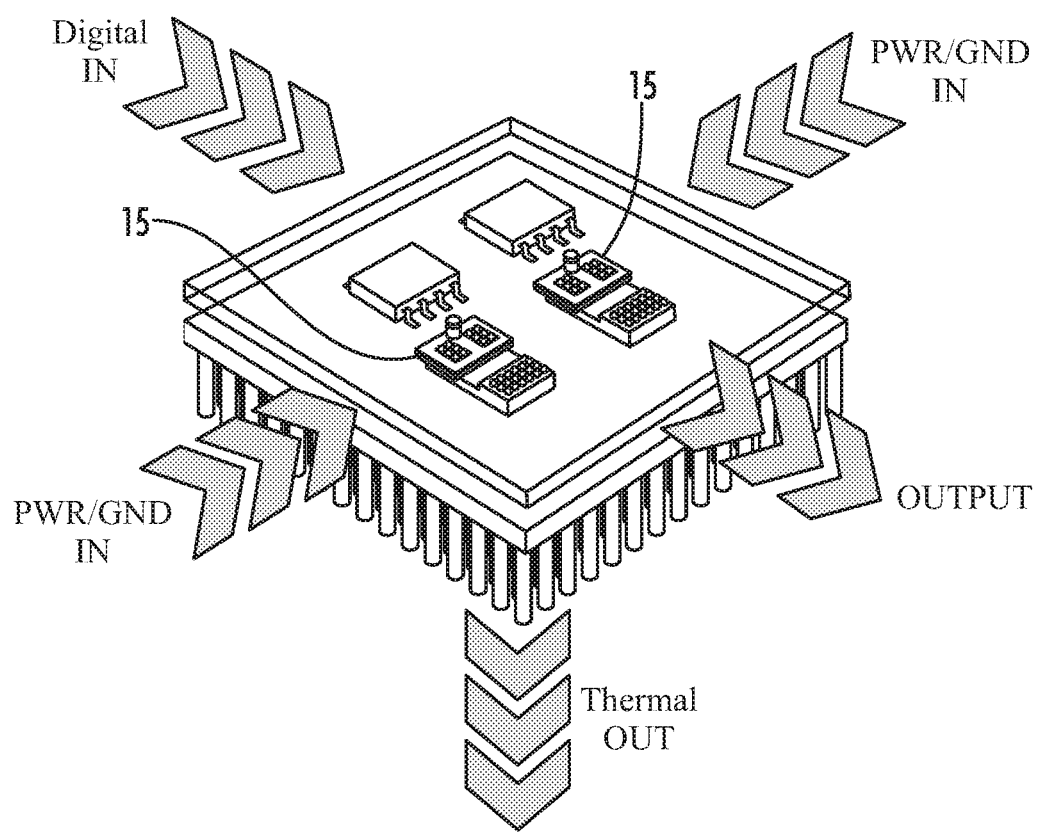
FIG. 1B is a schematic showing the inputs and outputs of the flip-chip power device implemented in a generic power electronics system.
Figure 1C:
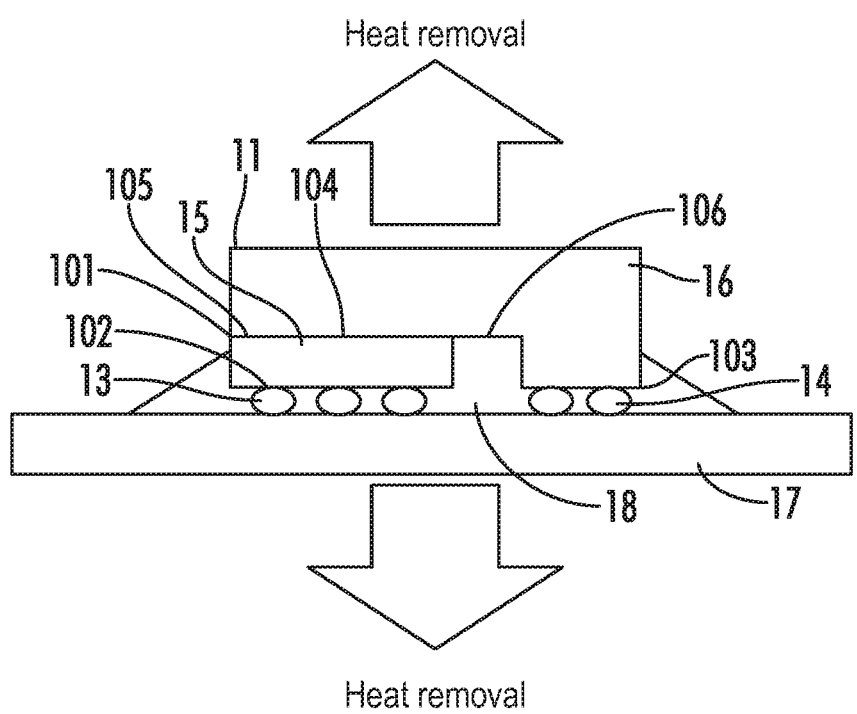
FIG. 1C is a schematic showing how top and bottom heat removal is improved by the flip-chip power device.

A preferred embodiment is depicted in the schematic shown in FIG. 1B, where the gate driver circuits may be populated on the top side of an interposer, with the power devices 15 flip-chip bonded to the bottom tier. FIG. 1C depicts a schematic showing how heat may be removed in an exemplary configuration. Heat may be removed from the bottom surface of the metallic connector 16 when the power device 15 is bonded to substrate 17 using top pad solder spheres 13 and bottom pad solder spheres 14 with underfill 18. In high-current applications which do not require ultra-fast switching and ultra-low inductances, heat may be efficiently removed from either side of the package by employing double-sided cooling methods as illustrated. This is impossible in previous state-of-the-art wire bonded silicon carbide power devices and modules.

Figure 1D:
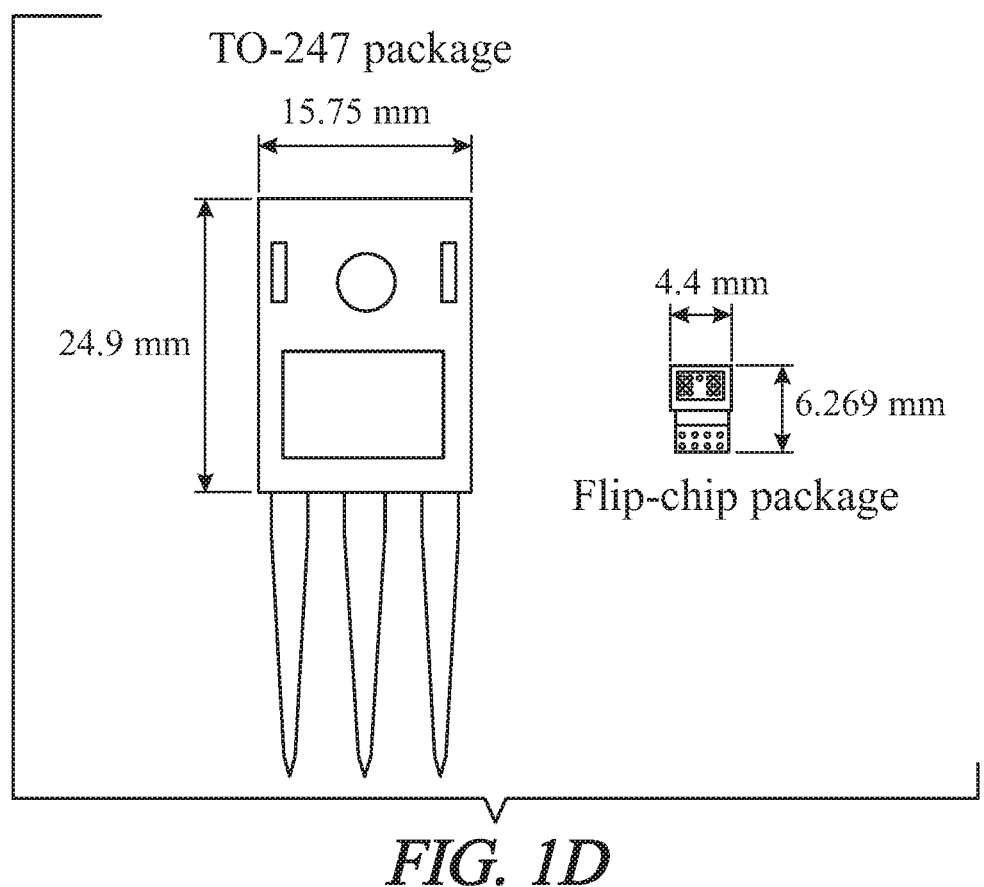
FIG. 1D is a schematic comparison of the size of a TO-247 package to a Flip chip package of the present invention.

The resulting package using a preferred method of assembly occupies a 14.24 times smaller footprint as compared with a conventional discrete TO-247 device as depicted in the photograph presented in FIG. 1D. This demonstrates the potential of realizing unprecedented power levels within a given volume.

The process flow for a preferred embodiment wherein a commercially available bare die MOSFET is reconfigured to a flip-chip MOSFET is described with reference to the flowchart shown in FIG. 2. The top-side metallization of commercially available bare die SiC power devices is aluminum. This is to facilitate the aluminum wire bonding process. The bottom side contacts, however, are always solderable to support the die attachment process. The only other viable method to achieve a metallurgical bond with aluminum is by using conductive epoxy. However, this runs the risk of increasing the contact resistance. The favorable effect of low parasitic flipchip interconnections may be completely offset by using an electrically, and thermally, inferior attachment material. Hence, achieving a solderable top contact is a first step in the process.

Figure 3:
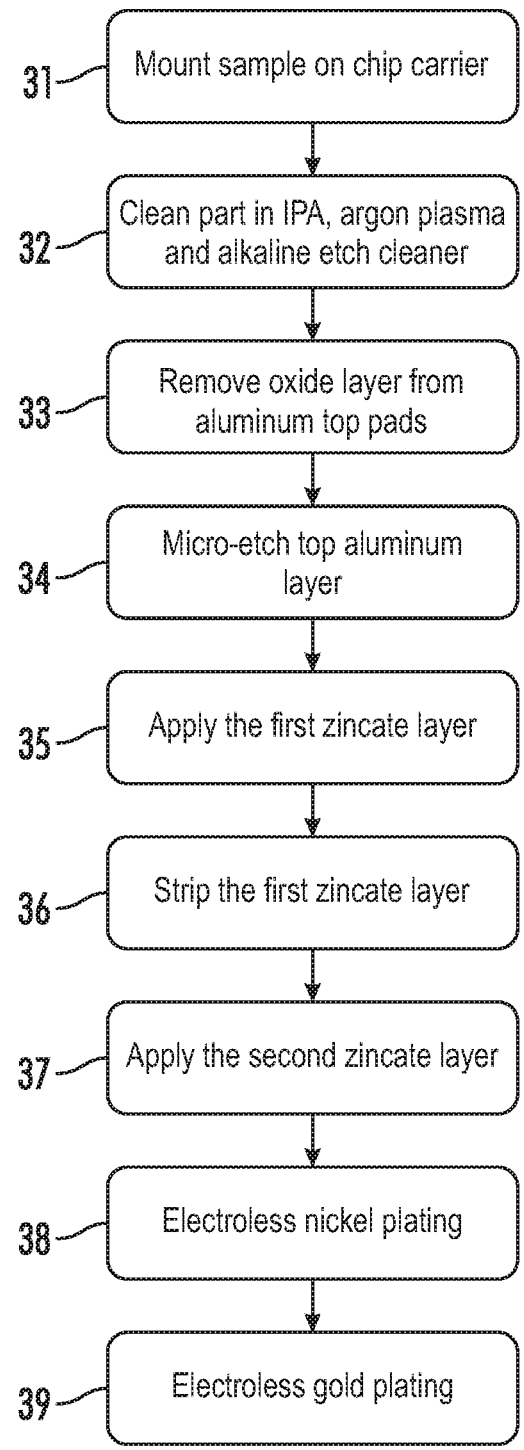
FIG. 3 is a flow chart showing a process flow for electroless plating of a bare power device according to some embodiments.

An exemplary optimized process flow used for re-metallizing the top surface is described in FIG. 3. In step 31, the bare die power devices are mounted on a chip carrier. Prior to mounting, the samples are rinsed thoroughly in isopropyl alcohol and dried. The part is subject to a rigorous cleaning procedure in step 32. The mounted samples are cleaned a second time for five minutes in an argon plasma. A third cleaning cycle is performed using a detergent-based cleaner.

The sample is then subjected to a three-cycle rinse. This ensures the deposition of highly adherent homogenous metal films.

The native oxide film on the surface of aluminum requires is removed in step 33 before plating. This can be achieved in two steps. During the de-oxidation step, the sample is immersed and mildly agitated in a de-smutting solution. In the next step 34, the sample is immersed in a solution of aluminum micro-etchant. This insures an oxide-free and pristine surface is presented for the deposition of the first zinc film. Failure to do this will result in insufficient adhesion and an inconsistent deposition of the zinc film. After rinsing the sample, the first zincate layer is deposited in step 35. The first layer is then stripped in 50% nitric acid in step 36. A second zincate step ensures a smooth and uniform zinc layer. In step 37, the second zincate process is deposited. The sample is subjected to a three-cycle rinse before the nickel plating step to prevent any possible bath contamination. Nickel plating is then performed in step 38. Finally, a layer of gold may be deposited in step 39 for better solder wettability and reliability.

Figure 2:
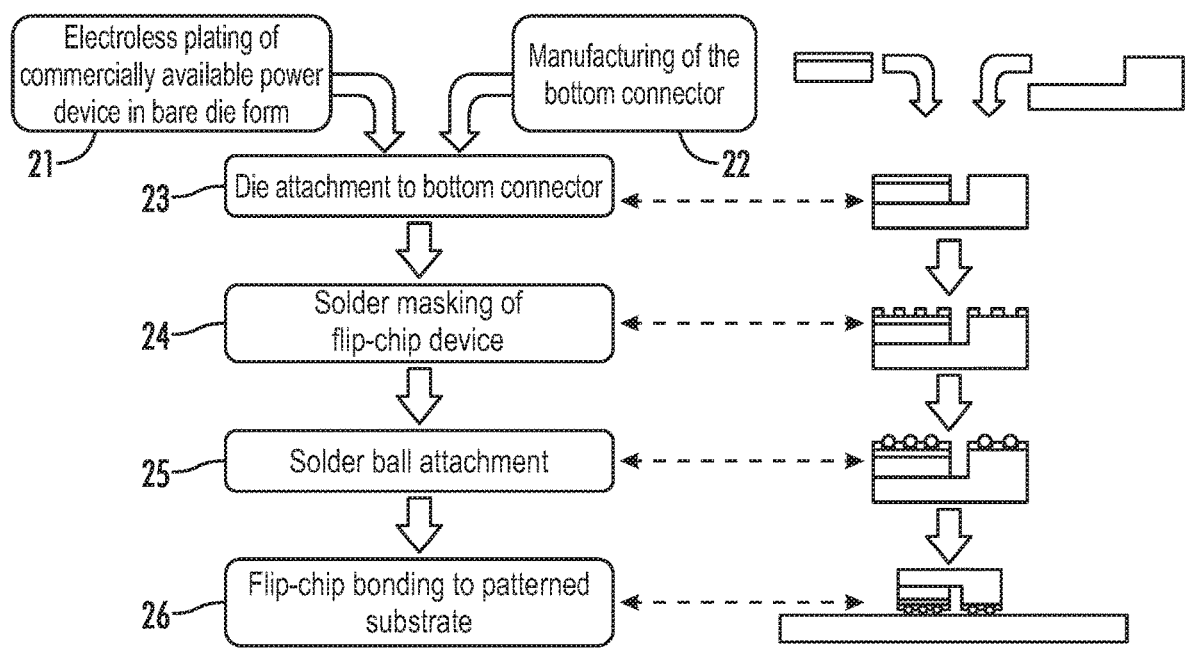
FIG. 2 is a schematic and flow chart showing exemplary methods to assemble a flip-chip power device using a bare die power device according to some embodiments.

One of the major benefits using electroless plating 21 as a metallization technique in the embodiment shown in FIG. 2 is that it does not require any additional masking, photolithography, or lift-off step. It is completely self-patterning and saves on the cost and complexity of the re-metallization process. It also forms the zinc, nickel, and gold layers directly atop the aluminum layer, thereby adding negligible contact resistance. The bottom connector 11 may be milled out of a copper sheet using a CNC machine in step 22. A wet etching process may also be employed to achieve similar results.

In step 23 in the embodiment in FIG. 2 is the die attachment to the bottom connector, which Attachment of the bottom connector, which may be performed using high-temperature solder, like SAC305, or sintered silver. The solder balls 13, 14 used for flip-chip attachment are of lower reflow temperature than the die-attach material 105. Using a die-attach with a higher reflow temperature for the die attachment process will ensure that the die remains securely attached to the bottom connector during the flip-chip bonding step. A stencil may be used to squeegee a thin layer of die-attach paste on a die-sized area on the drain connector. The die may then be placed using a vacuum pickup tool, and a custom fixture may be used to secure the die in position while it passes through the reflow step. The reflow may be performed using a well-controlled profile set on a reflow oven or hot plate. After the reflow process the sample will be rinsed thoroughly with isopropyl alcohol and blow-dried.

A dry film solder mask, which is a photosensitive material akin to dry film photoresist, may be used for the solder masking process shown in step 24 of this prefer-ed embodiment. A thermal laminator may be used for laminating a thin layer of dry film solder mask on the surface of the flip-chip device. Alternatively a photo-patternable isolation material like benzocyclobutene (BCB) or polyimide (PI) may also be used to the same end if the application so demands. The next step in the process is photolithography. A mask containing the pattern of the solder ball array is mounted on a transparent glass plate and aligned to the bond pads of the flip-chip package on an optical aligner. The solder ball bond pads may be undersized by 20% to help the solder ball retain a spherical shape after reflow. After UV light exposure, the sample may be developed in a suitable bath. Once the bond pads are sufficiently developed, the sample will be rinsed thoroughly in DI water and dried.

In step 25, solder balls are attached to the solder masked flip-chip power device. In order to secure the solder balls in position, a low temperature solder may be used. The melting point of this solder must be lower than the material of the solder ball. The ball attachment solder paste may be stenciled on to the open pads on the surface and the solder balls placed on the wet paste.

A flip-chip bonder may be used for the attachment of the power device in step 26. The sample is mounted on the top arm of the flip-chip bonder. The substrate has matching pads on to which the die maybe placed. The substrate may be designed such that it accommodates multiple flip-chip power devices. The power devices may also be hand-placed on the substrate by aligning to a patterned package outline on the substrate surface. The self-centering property of solder offsets any minor inconsistencies in alignment due to surface tension. No-clean tacky flux may be used on the substrate surface to help secure the flip-chip MOSFETs in position during the placement and reflow process. The flux aids in cleaning and de-oxidizing the substrate bond pads during reflow. The flip-chip devices may be underfilled to help bolster the mechanical strength of the solder balls and to provide additional voltage isolation under operating conditions. A person having skill in the art will recognize and appreciate that different configurations, materials, and processes can be substituted.

EXAMPLE

The following example provides a detailed account of the manufacturing process and electrical testing of a preferred embodiment of the invention. First the process of fabricating a flip-chip MOSFET package, starting from a commercial off the shelf bare die power device is described following by a description of a test setup and test results of the fabricate samples.

Figure 4:
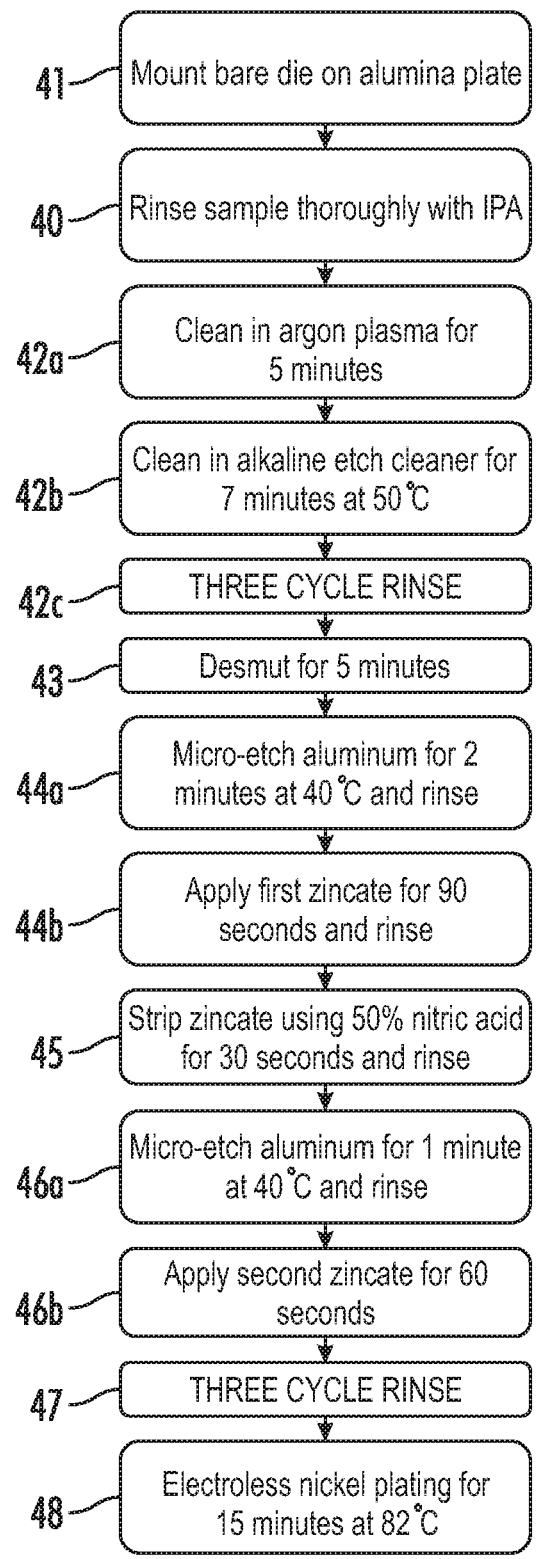
FIG. 4. is a flow chart showing a process flow for electroless plating of a bare power device according to some embodiments.

In the first step of this example, the re-metallization of the top side contact of bare power devices were performed as shown in FIG. 4. Prior to mounting, the samples were rinsed thoroughly in isopropyl alcohol and dried in step 40. The bare die power devices were mounted on 1"×1" alumina plates using double sided Kapton tape in step 41. The mounted samples were cleaned a second time for five minutes in an argon plasma in step 42a. A third cleaning cycle was conducted using an alkaline etch cleaner, MCL-16, purchased from UYEMURA, 3990 Concours, #425 Ontario, CA 91764 in step 42b. The sample was then subjected to a three-cycle rinse in step 42c.

The native oxide film on the surface of aluminum was removed before plating. This was achieved in two steps. During the de-oxidation step 43, the sample was immersed and mildly agitated in a de-smutting solution purchased from Caswell. In the next step 44a, the sample was immersed in a solution of aluminum etchant purchased from Transene Company, Inc. The solution temperature was maintained at 40 oc for 2 minutes. After rinsing the sample, the first zincate layer was applied for 90 seconds in step 44b. In step 45, the first layer was then stripped in 50% nitric acid for 30 seconds and rinsed. In step 46a, the sample was again immersed in aluminum etchant, this time for 1 minute at 40° C. After rinsing, a second zincate layer was applied for 60 seconds in step 46b. The sample was then subjected to a three-cycle rinse in step 47 before the nickel plating step 48 to prevent any possible bath contamination. Nickel plating was performed for 15 minutes at a solution temperature of 82° C.

Figure 5:
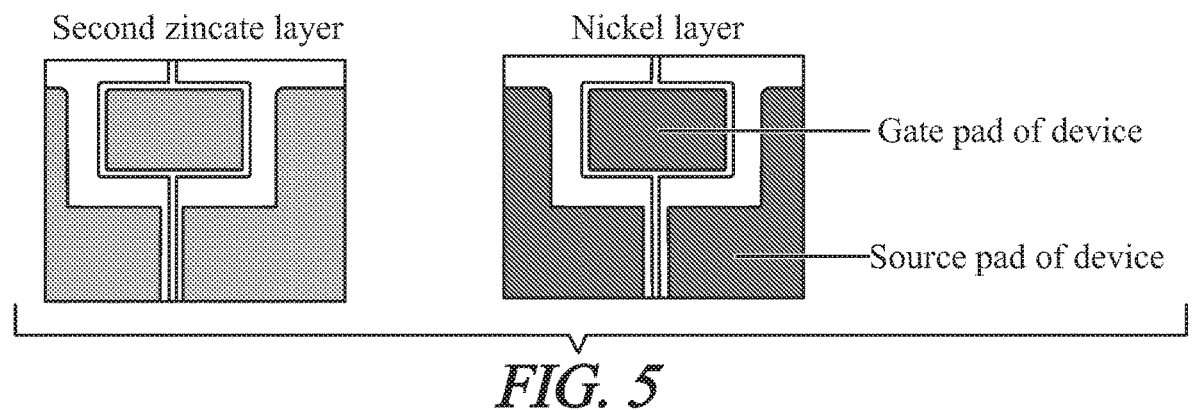
FIG. 5 is an optical microscope image showing the electroless plated metal layers on the original aluminum pads of a bare die power device.

FIG. 5 shows an optical microscope image of the second zincate layer and the nickel layer. The fine granular zincate layer can be clearly observed and the probe marks on the gate pad are still visible. The probe marks are no longer visible once the thick nickel plating is complete. The photographs show a uniform nickel layer which is clearly defined without any dendritic formations posing the risk of an electrical short. This illustrates one of the major benefits using electroless plating as a metallization technique. It does not require any additional masking, photolithography, or lift-off step. It is completely self-patterning and saves on the cost and complexity of the re-metallization process. It also forms the zinc and nickel layers directly atop the aluminum layer, thereby adding negligible contact resistance.

Figure 6:
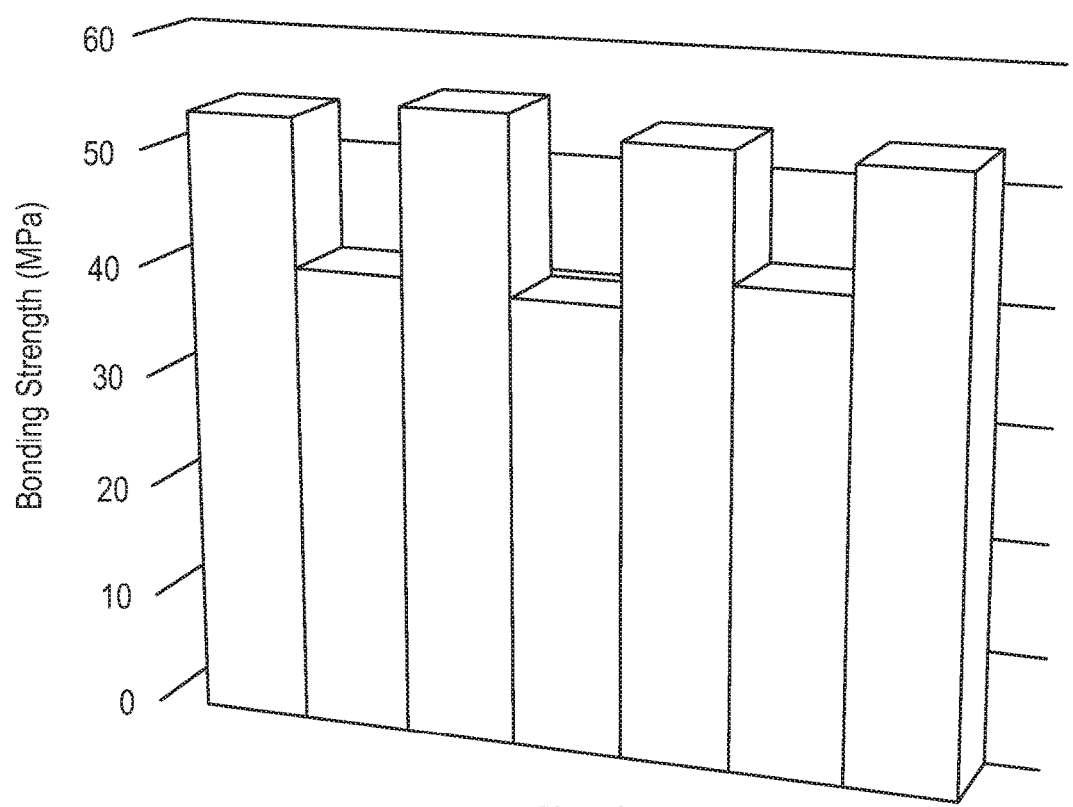
FIG. 6 is a graph of results of a ball shear test conducted on randomly picked solder balls bonded to a deposited nickel metallization layer.

Ball shear tests were also conducted on the deposited metallization. The results, as presented in FIG. 6, showed a very high bonding strength. In most cases, the failure occurred as a result of the ball being flattened by the shear tip, and not by a ruptured bond. This served as a satisfactory qualification of the metallization process.

The attachment of die to the drain connector was performed using SAC305 solder.

Figure 7A:
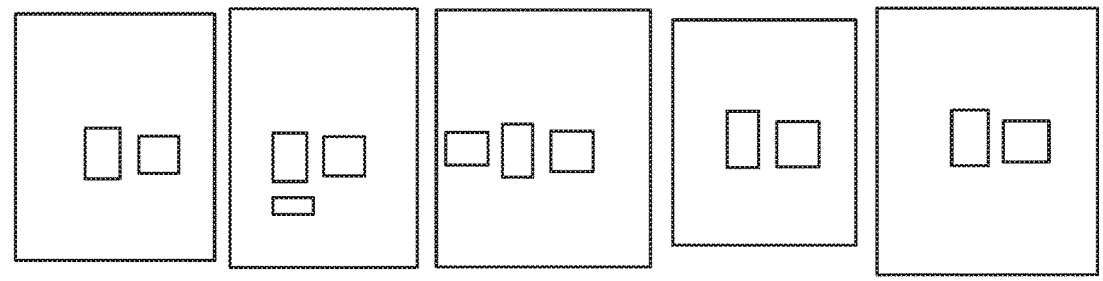
FIGS. 7A-7B are photographs of samples secured in place by a Kapton stencil prior to reflow and samples including a pair of finished samples in the bottom right corner.
Figure 7B:
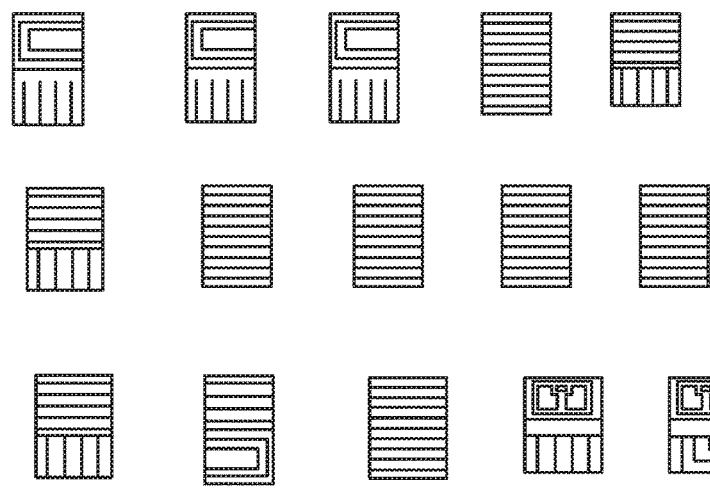

The bottom connector was milled using a CNC machine. The reflow temperature of SAC305 solder is 249° C. The solder balls used for flip-chip attachment were 62Pb36Sn2Ag which has a reflow temperature of 220° C. Using SAC 305 for the die attachment ensured that the die would remain securely attached to the drain connector during the flip-chip reflow step. A stencil fashioned from a 3 mil Kapton sheet was used to squeegee a thin layer of SAC305 on a die-sized spot on the drain connector. The die was then placed using a vacuum pickup tool, and the same Kapton stencil was used secure the die in place while it was passed through reflow. The reflow was performed using a well-controlled profile set on a SIKAMA reflow oven, SIKAMA INTERNATIONAL, INC., 118 E Gutierrez Street, Santa Barbara, Calif. 93101 USA. The Kapton film fixture was carefully removed after the reflow process, and the sample was rinsed thoroughly with isopropyl alcohol and blow-dried. FIG. 7A shows a photograph of the Kapton fixture and a pair of die after attachment. FIG. 7B also shows blank CNC machined bottom connectors.

A dry film solder mask, Dynamask 5000 Series from Rohm and Haas Electronic Materials LLC, 455 Forest Street, Marlborough, Mass. 01752 was used for the solder masking process, a photo-sensitive material akin to dry film photoresist. A common desktop laminator was used for laminating a thin layer of dry film solder mask on the surface of the flip-chip device.

Figure 8:
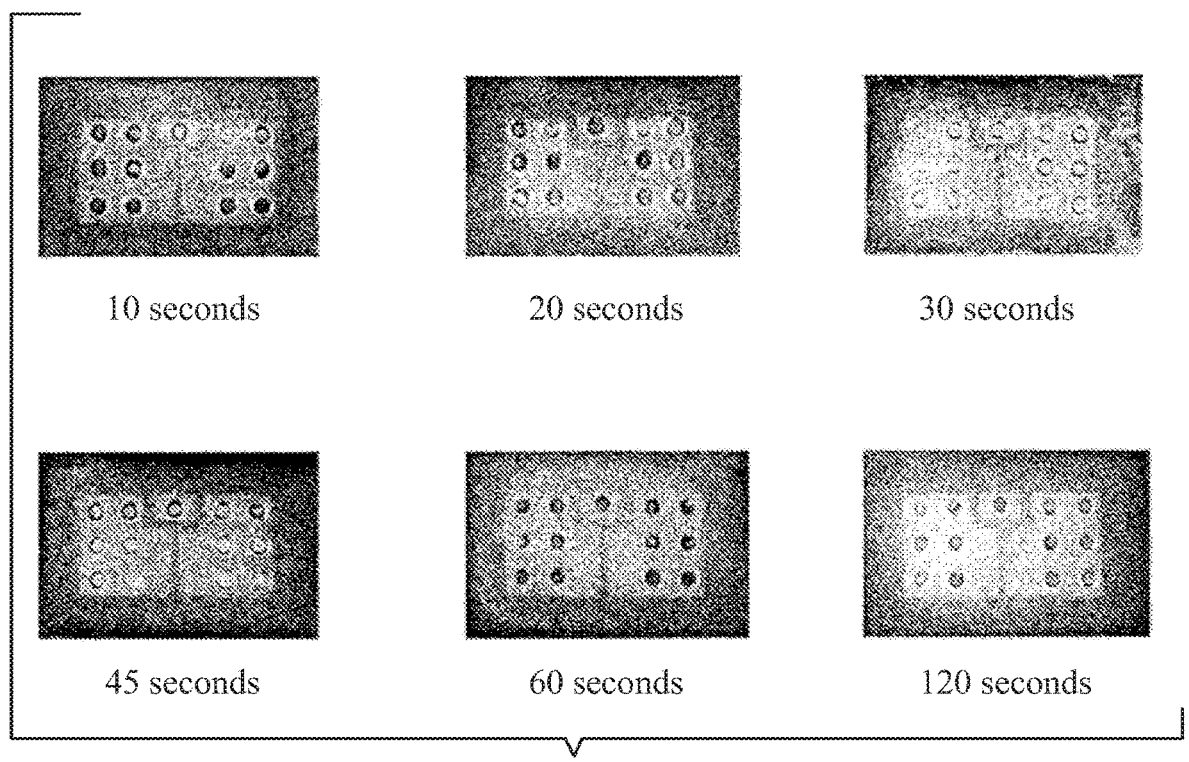
FIG. 8 are photographs showing optimization steps performed to ascertain a proper exposure time.

The next step in the process was photolithography. A mask containing the pattern of the solder ball array was mounted on a transparent glass plate and aligned to the bond pads of the sample on a Karl Suss optical aligner, SUSS MicroTec Inc., 220 Klug Circle, Corona, Calif. 92880-5409 USA. FIG. 8 shows the optimization step performed to ascertain a proper exposure time. The openings for the solder balls were designed to be 10 mils in diameter. The solder balls themselves were 12 mils in diameter. Solder ball bond pads are undersized by 20% to help the solder ball retain a spherical shape after reflow.

After exposure, the sample was stored in a dark enclosure for 60 minutes. The development process was performed in a bath of 10% sodium carbonate solution for 6 minutes. The development process was aided with mechanical scrubbing of the solder mask surface using a soft paintbrush. Once the features were clearly discernible, the solder mask was cured under continuous UV light for 90 minutes.

Figure 9:
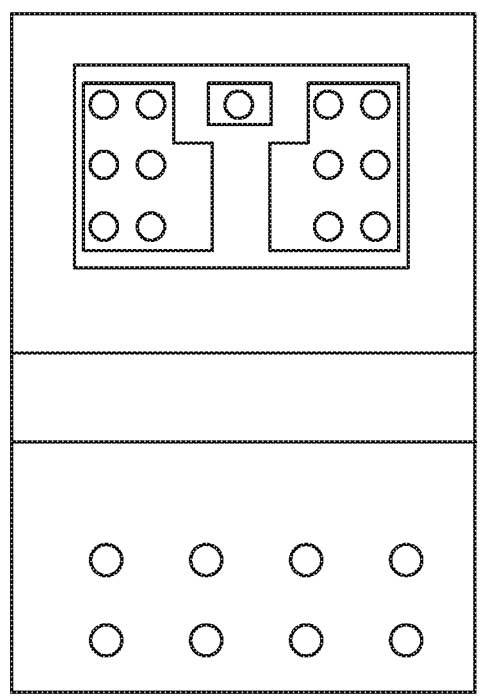
FIG. 9 is a photograph showing a solder-ball bumped flip-chip power device.

In the solder ball attachment step, solder spheres of 12 mil diameter were attached to the solder masked flip-chip MOSFET. In order to secure the solder balls in position, a low temperature solder was used. The composition of the solder spheres was 63Pb36Sn2Ag with a reflow temperature of 220° C. The composition of the ball attachment solder was Sn42Bi58 with a reflow temperature of 165° C. The solder paste was stenciled on to the open pads on the MOSFET surface and the solder balls were placed on the wet paste. FIG. 9 shows a photograph of a solder-ball bumped sample.

Figure 10A:
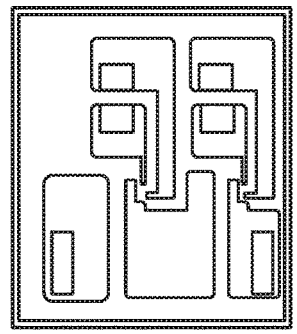
FIG. 10A shows a patterned substrate in the form of a half bridge.
Figure 10B:
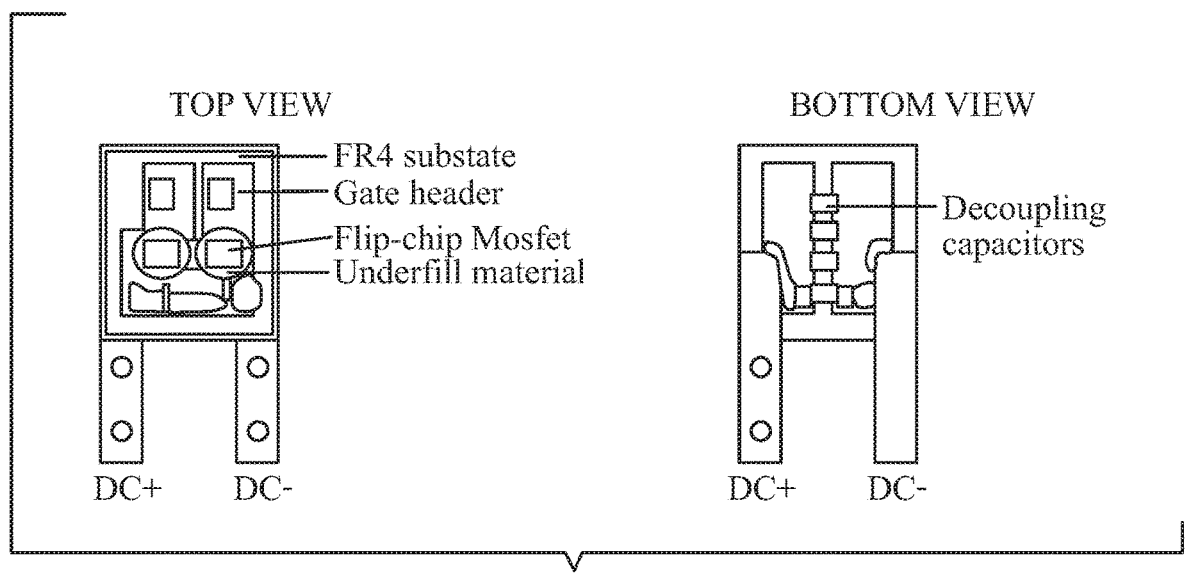
FIG. 10B shows a module with busbars and gate connection headers

A flip-chip bonder was used for flip-chip attachment. The sample was mounted on the top arm of the flip-chip bonder. A substrate was patterned using the same process which was used to pattern the flip-chip MOSFET. The substrate material was FR-4 and a finished sample can be seen in the photograph presented in FIG. 10A. The substrate was designed such that it accommodated two flip-chip MOSFETs in a half-bridge configuration. Two flip-chip MOSFETs were flip-chip bonded to the substrate and reflowed in situ on the heated stage of the flip-chip bonder. No-clean tacky flux was used on the substrate surface to help secure the flip-chip MOSFETs in position during the placement and reflow process. The flip-chip devices were underfilled to help bolster the mechanical strength of the solder balls and to provide the necessary voltage isolation under operating conditions. The underfill was purchased from HENKEL CORPORATION, 200 Elm Street, Stamford, Conn. 06902-3800 and the part number was ECCOBOND FP4549. A photograph of the module with busbars and gate connection headers is shown in FIG. 10b.

Electrical Testing

Figure 11:
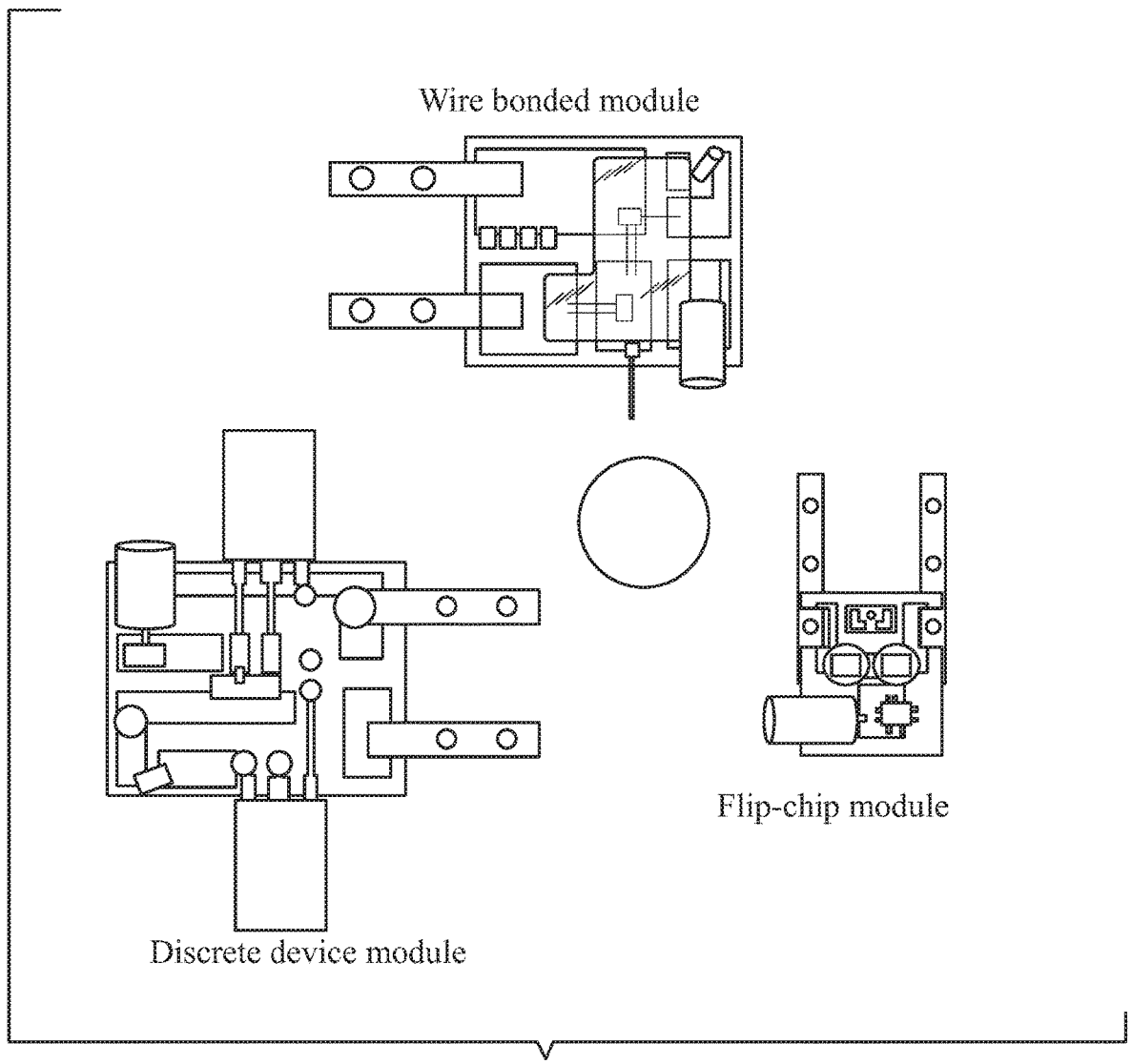
FIG. 11 is a photograph showing three modules tested for comparison.

Three samples were fabricated to study the beneficial effects of the low parasitic inductance offered by the proposed flip-chip bonded power MOSFETs. The first sample was a half bridge constructed using conventional discrete ROHM MOSFETs in a TO-247 package. The second module was constructed using bare die ROHM MOSFETs. The wire bonded electrical signal paths were kept to a minimum to realize the shortest possible lateral power loop. This approach is preferred over using discrete devices since it gives the designer more control over minimizing the parasitic inductances of the critical signal loops. It is also less volume intensive in case devices need to be connected in parallel to increase the current handling capability. The third half-bridge was constructed using the flip-chip bonded power devices. It must be noted that all the modules employed the same bare die MOSFET. This was intentionally planned to ensure that any observed differences in performance would be a result of the packaging alone. FIG. 11 shows a photograph showing the three samples compared to the size of a United States quarter for comparison. It was apparent that the half bridge module could be accommodated in much less FR4 real estate.

Figure 12B:
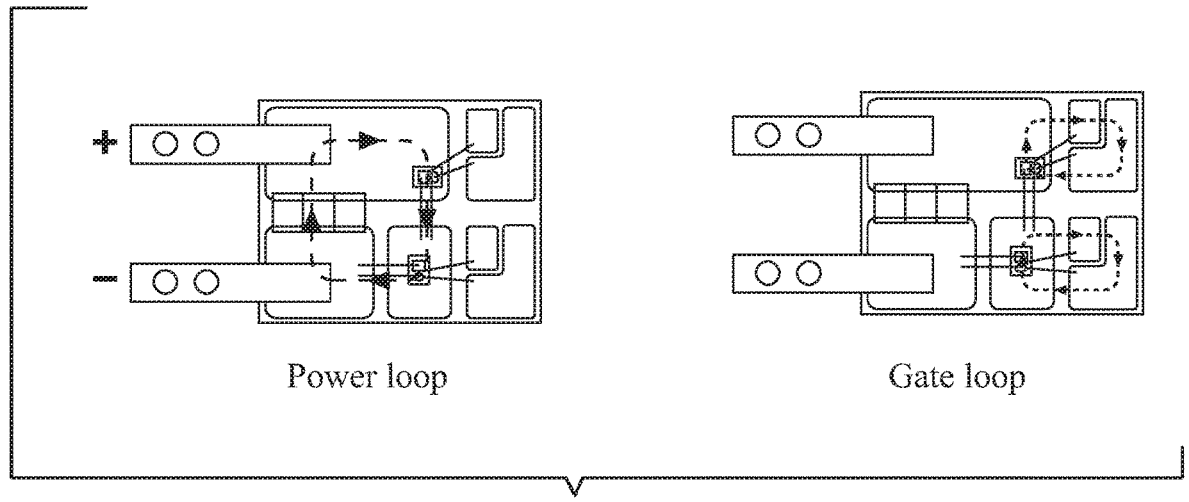
FIG. 12B is a schematic depicting a reduced power loop area using a vertical loop layout.
Figure 12B:
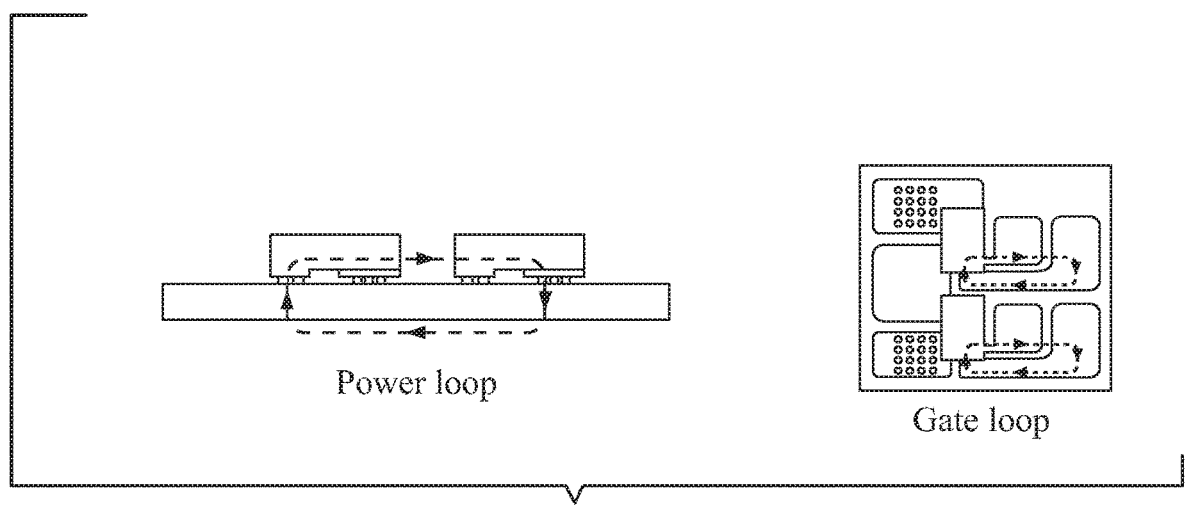

FIGS. 12A-12B illustrate an advantageous configuration enabled by this flip-chip device invention. In conventional SiC power modules and systems the power loop is always lateral. This is depicted pictorially in FIG. 12A. This restricts a module designer to a minimum loop area defined by critical tolerances in the circuit. Even the most optimized lateral power loop often has a parasitic inductance of 15-20 nH. The situation is understandably even worse in the case of discrete devices. Also, in conventional power modules, there needs to be a ground plane beneath the switching loops to minimize switching transients. Flip-chip devices enable a vertical loop design as described in FIG. 12B. The ground plane requirement is eliminated for a vertical loop due to return path cancellation. Such innovative circuit designs are not possible to implement with conventional power module technology. The topside of the power devices are unavailable for stacked 3D topologies due to the presence of bond wires. The proposed flip-chip topology solves that problem. The critical switching loops are outlined in FIGS. 12A-12B.

Figure 13:
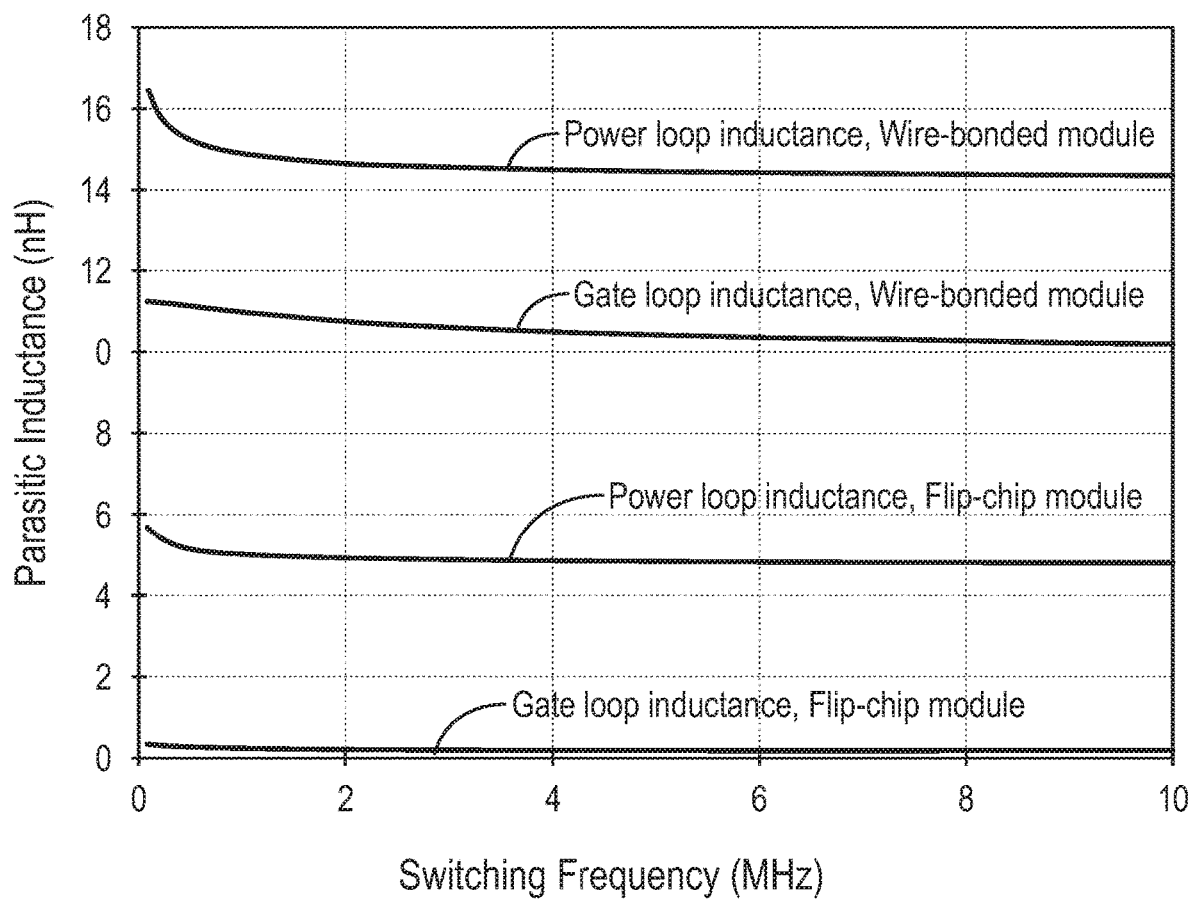
FIG. 13 is a graph of results of a finite element simulation contrasting the critical loop inductances of the flip-chip module and a conventional wire-bonded module.

Finite element simulations were conducted in ANSYS Q3D to estimate the critical loop inductances of the wire bonded and flip-chip approach. Frequencies from 100 kHz to 10 MHz were simulated and the results are shown plotted and compared in FIG. 13. It was observed that the vertical loop design was much superior to a conventional design in principle.

Figure 14A:
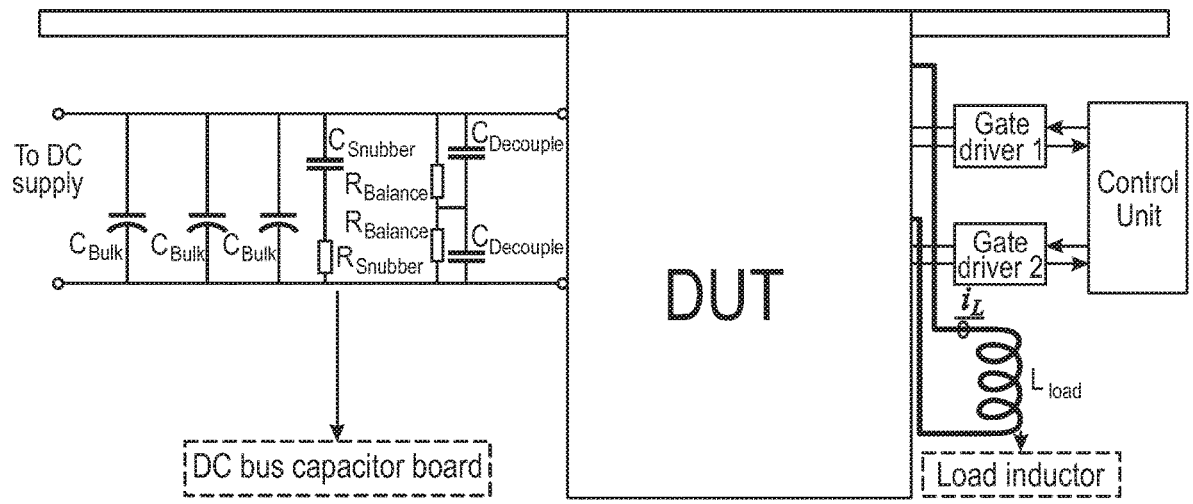
FIG. 14A shows a schematic of a standard double pulse test setup.
Figure 14B:
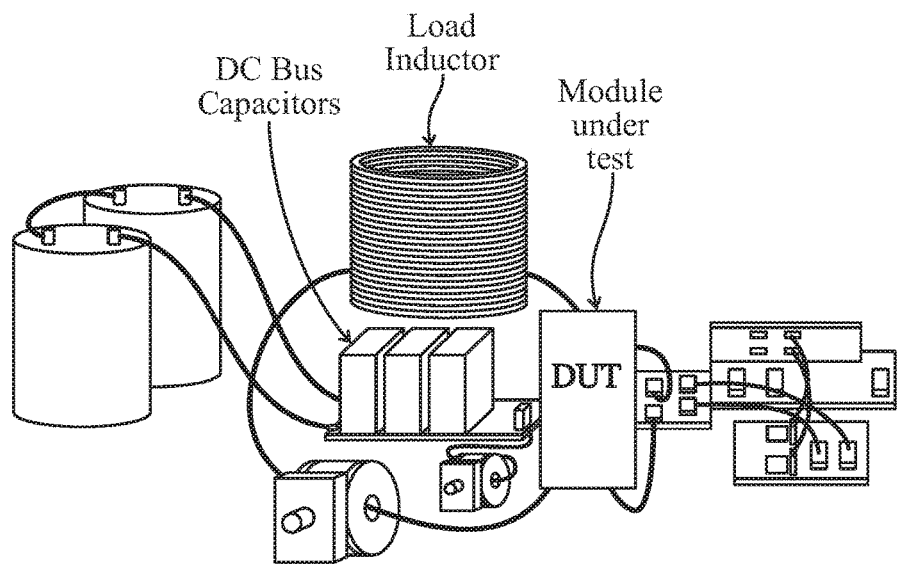
FIG. 14B shows the test setup used for the study.

The electrical test results confirmed the simulation results. A double pulse test was used to test the samples. FIG. 14A shows a schematic of a standard double pulse test setup, and FIG. 14B shows a photograph of the test setup used for this study. The double pulse test is a relatively safe method to measure the switching characteristics of a power module. The ringing frequency during the turn-off of the low-side MOSFET can also be used to estimate the loop inductance of the power loop. It must be noted that all waveforms were measured at a maximum DC bus voltage of 300 V due to the limitation of the available oscilloscope and probes. While the results are expected to be even better at higher voltages close to the device rating, the trends observed at 300V are clearly indicative of the major benefits of the invention.

Figure 15A:
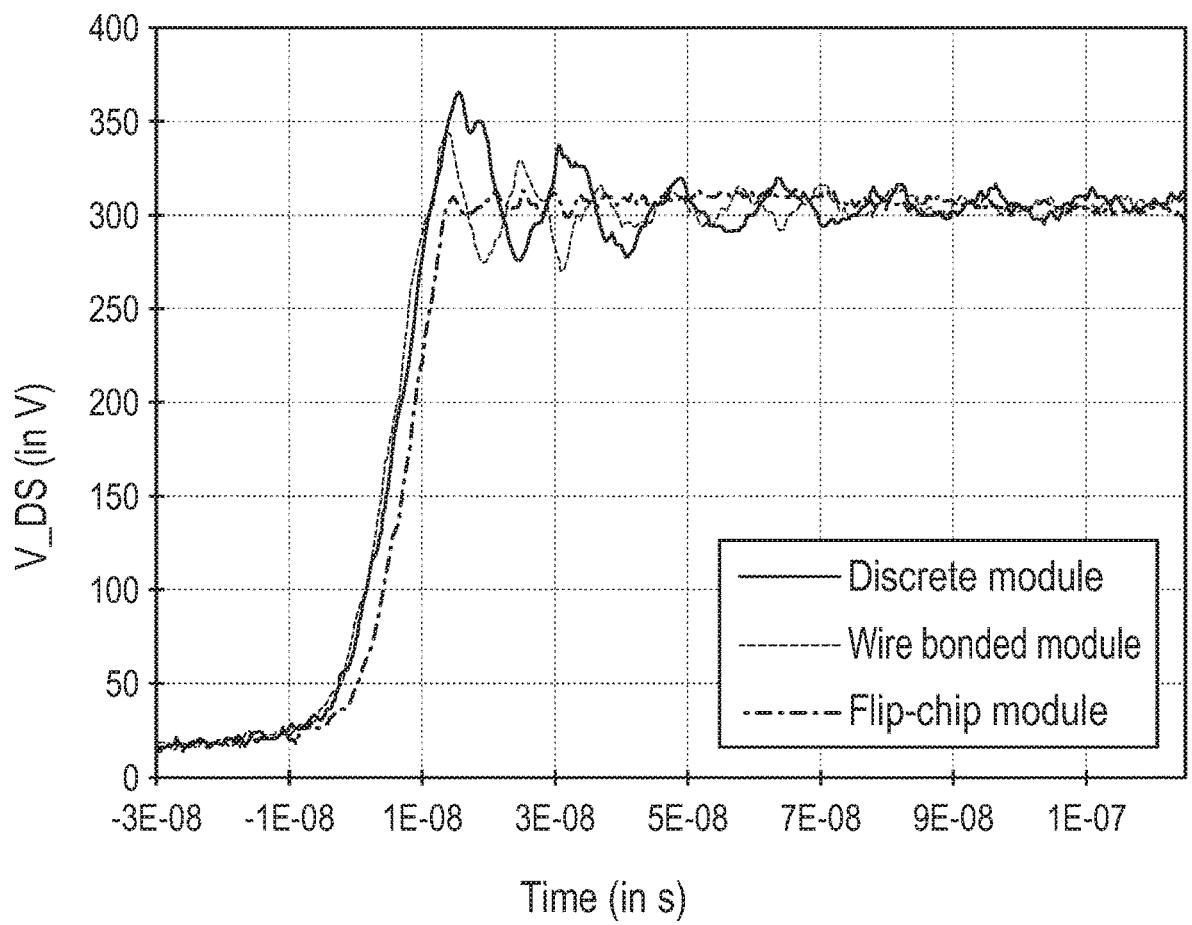
FIG. 15A is a graph depicting the measured turn-off waveforms of the three modules.

A double-pulse waveform was applied to the gate of the low side MOSFET of each module. The high-side device was forcibly held in the OFF state by electrically shorting the gate and source. Hence the high-side MOSFET essentially functioned as a diode. The turn-off and turn-on waveforms were measured across the drain and source terminals of the low side MOSFET. The current through the inductor was also measured. FIG. 15A shows the turn-off waveforms for the MOSFET. Compared to the discrete and wire bonded modules, the overshoot and ringing was reduced by 14.2% and 8.7% respectively using the flip-chip MOSFETs. The time period of the ringing in each waveform was measured using the oscilloscope cursors, and the estimated loop inductances are shown in Table 1.

TABLE 1

The measured parasitic power loop inductance from the oscilloscope waveforms.

| Output capacitance of the MOSFET ($C_{oss}$) | Time period of ringing (s) ($\Delta t$) | | Parasitic Loop Inductance (nH) = $C_{oss} \times 10^9$ | | |
|---|---|---|---|---|---|
| | Discrete | Wire-bonded | Flip-chip | Discrete | Wire-bonded | Flip-chip |
| 110e-12 | 13e-9 | 8e-9 | 4.6e-9 | 38.96 | 15.4 | 4.88 |

Figure 15B:
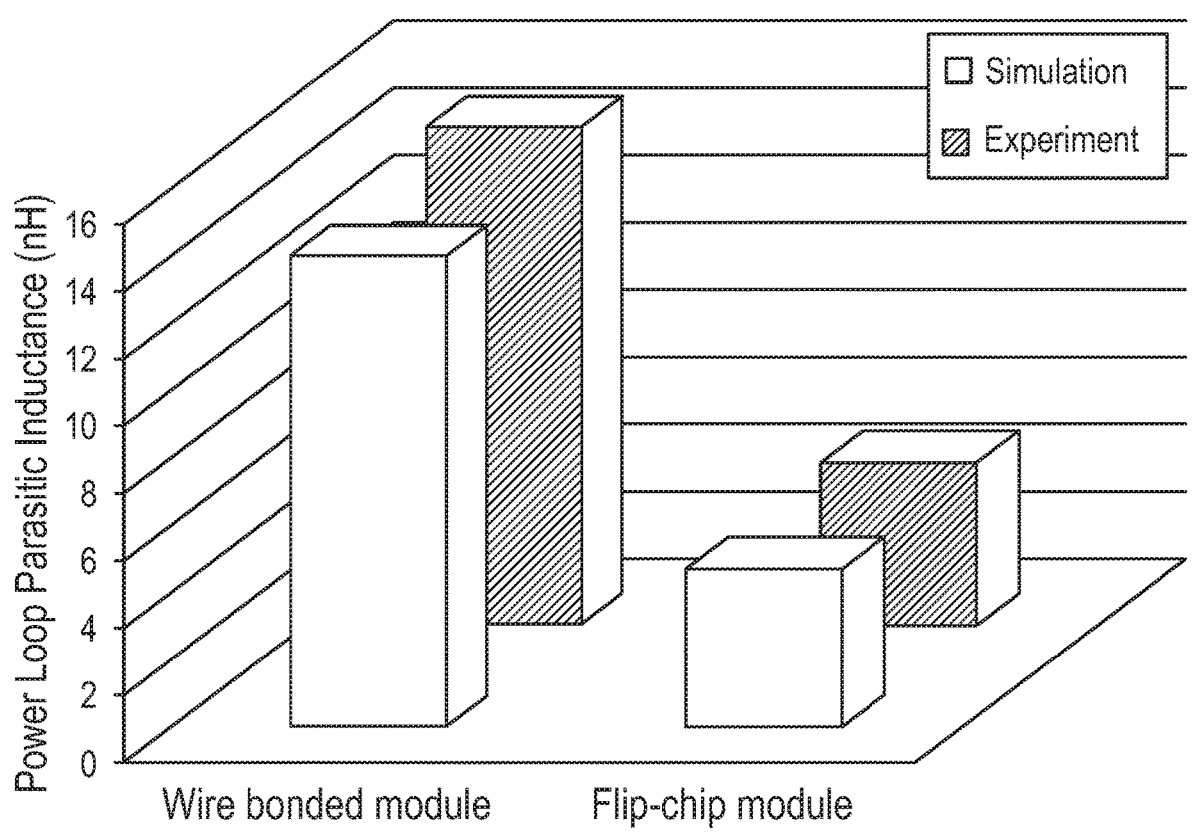
FIG. 15B is a graph depicting a comparison between the estimated and measured loop parasitics.
Figure 15C:
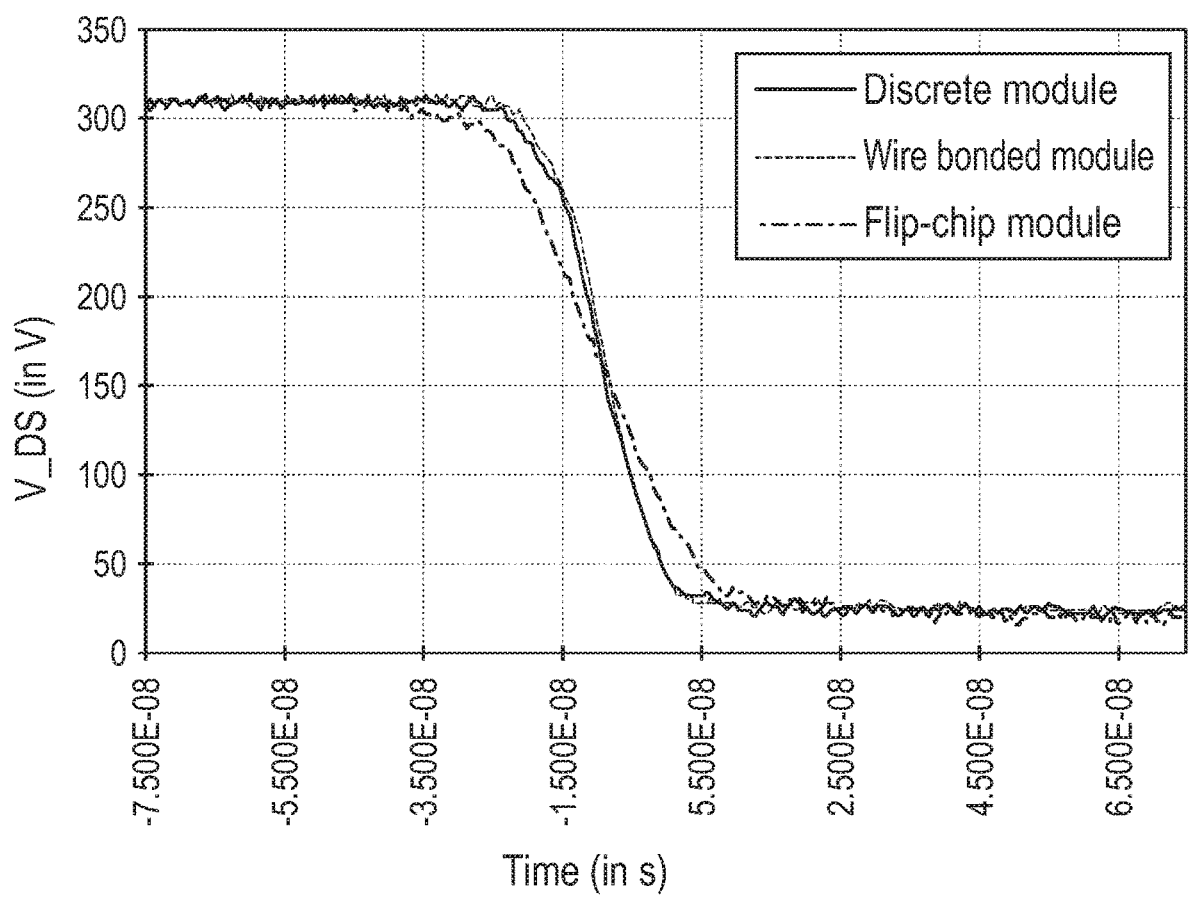
FIG. 15C is a graph depicting the turn-on waveforms of the three modules.
Figure 15D:
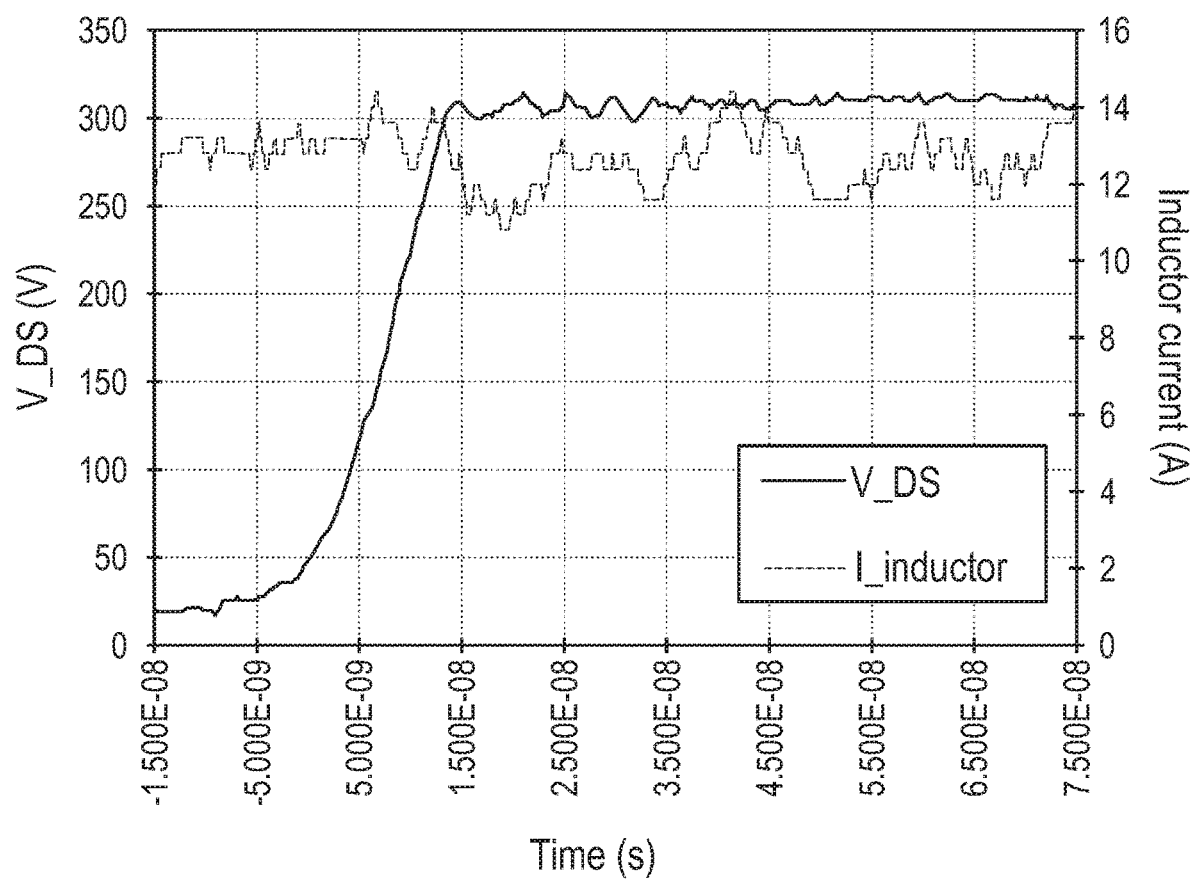
FIG. 15D is a graph depicting inductor current of the flip-chip module.

FIG. 15B shows a comparison between the simulated and measured power loop inductances for the wire-bonded and flip-chip module, and the error in the estimated inductance was found to be 4.96% and 3.84% respectively. FIG. 15C shows the turn-on waveforms for the MOSFET. The turn-on waveforms were nearly identical for all the modules. The turn-on time for all the modules was about 20 ns and the turn-on time was measured to be about 16 ns. An inductor current of 12 A was drawn during all the tests. FIG. 15D shows the graph of the measured inductor current plotted alongside the turn-off waveform for the flip-chip half bridge module.

Figure 16A:
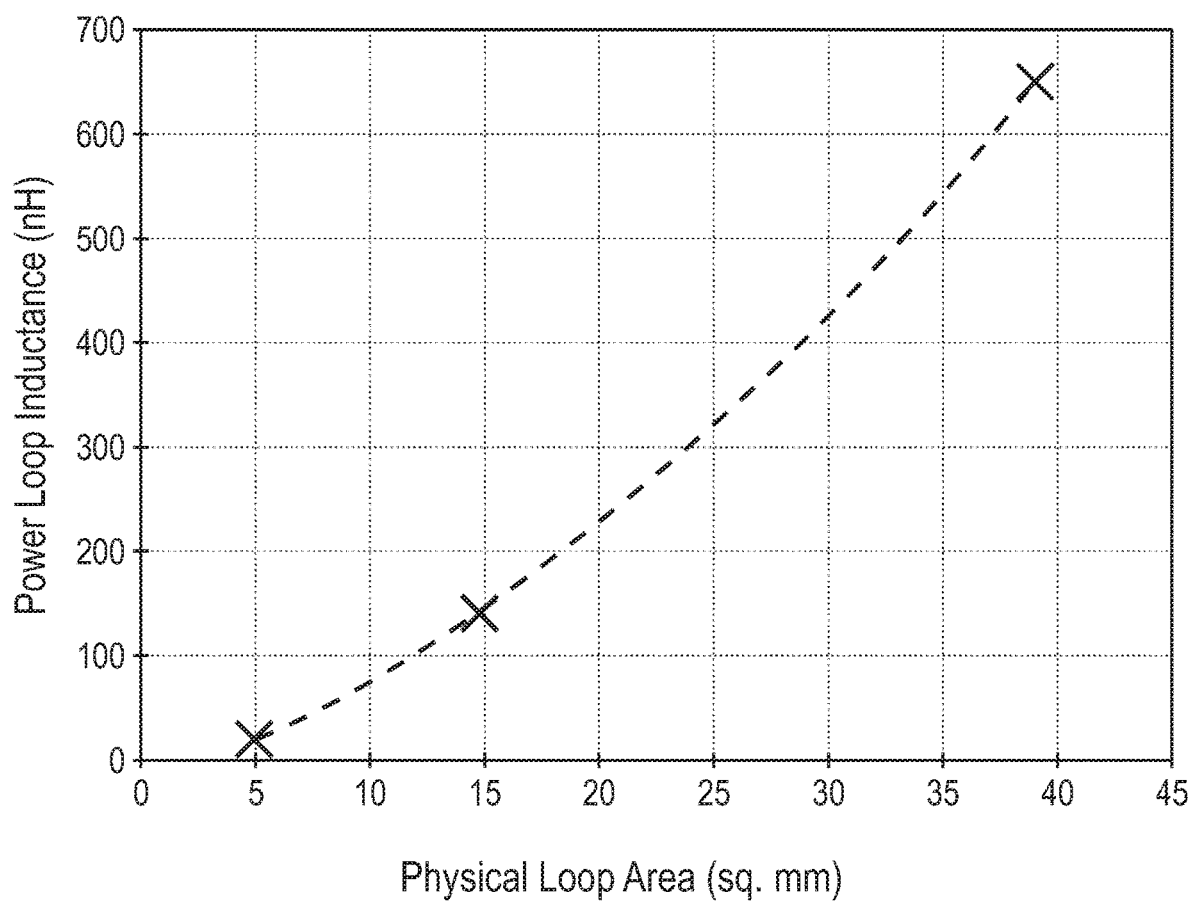
FIG. 16A is a graph showing the variation of power loop inductance with the loop area.
Figure 16B:
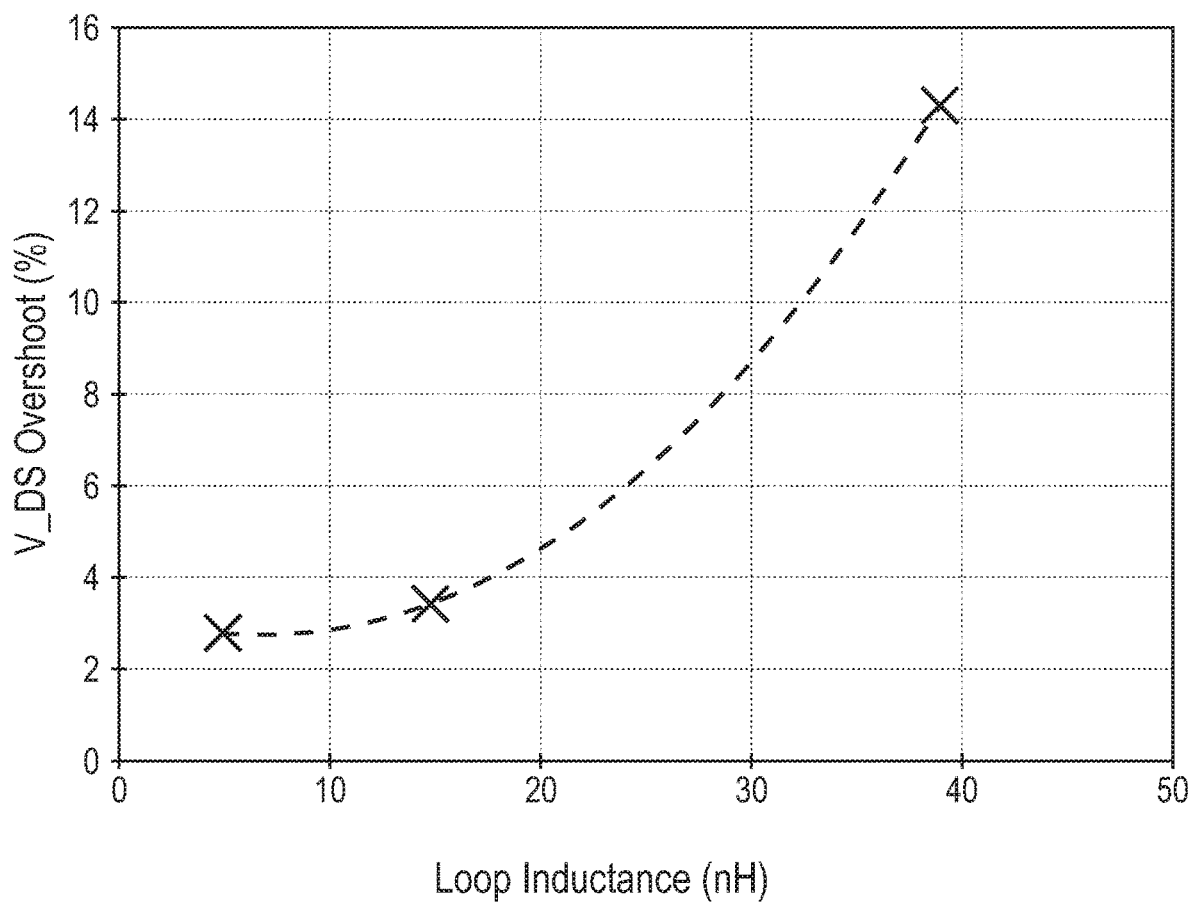
FIG. 16B is a graph showing the percentage overshoot as a function of parasitic power loop inductance.

FIG. 16A shows a comparison between the estimated loop area and the measured power loop parasitic inductance of the respective modules. FIG. 16B shows the relationship between the percentage overshoot with the measured loop inductance. This reaffirms the fact that tightly constrained critical loops are essential for obtaining high fidelity "textbook" waveforms even under high switching frequencies.

Figure 17A:
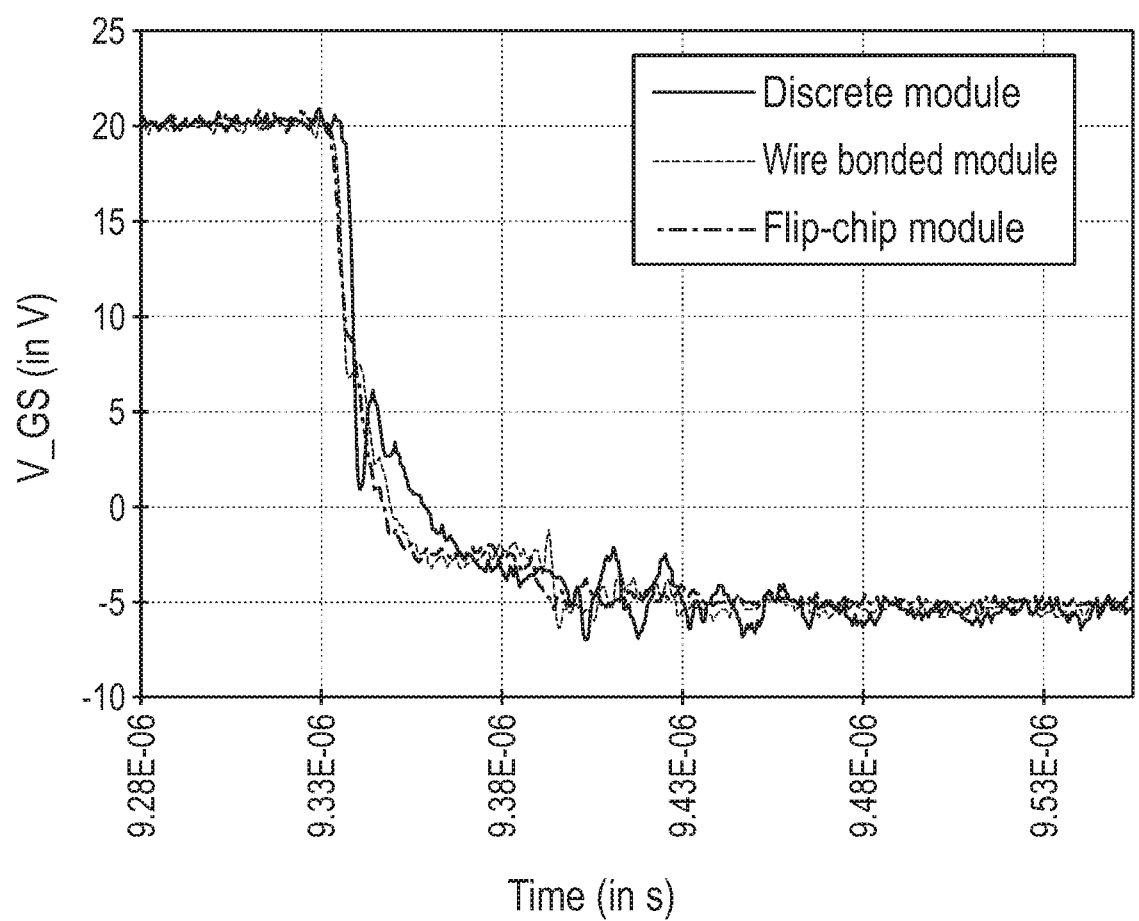
FIG. 17A is the measured waveform showing the gate turn-off of the three modules.
Figure 17B:
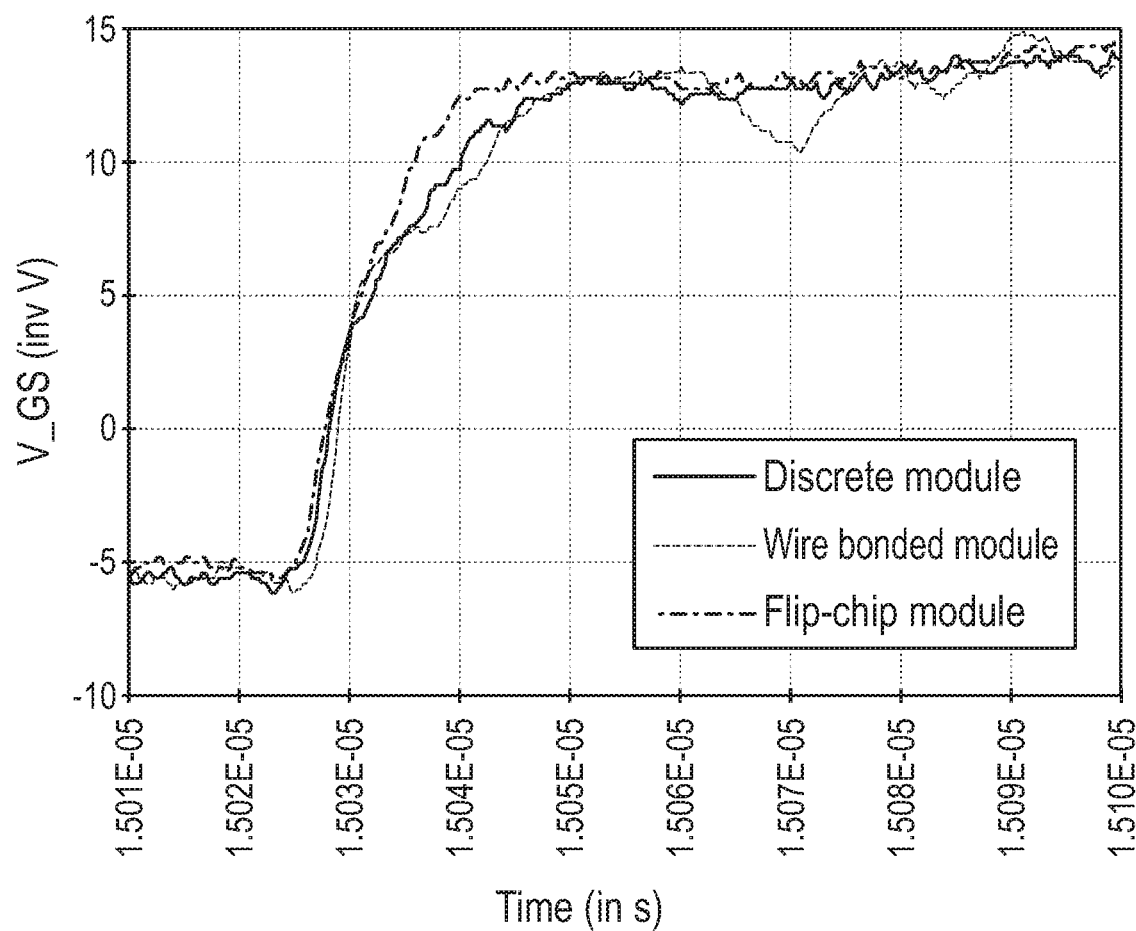
FIG. 17B is the gate turn-on voltages of the three modules.

The gate signal of the low-side MOSFET of the modules was also measured during the double pulse test. The fidelity of the gate signal is critical under high-frequency switching conditions. An excessive overshoot in the gate signal often results in a false turn-on condition resulting in module failure. As with the power loop, the key to reducing the overshoot in the gate loop also lies in low inductance signal paths. The discrete module had the longest (and consequently the most inductive) gate-source path due to the absence of a dedicated Kelvin source connection. The wire bonded module was provided with a dedicated Kelvin source return, as was the flip-chip module. The MOSFET gate turn-off waveforms are shown plotted in FIG. 17A. There are overshoots observed at multiple locations during the gate turn-off in the discrete and wire bonded modules. A transient-free smooth waveform can be obtained using a flip-chip module with a vertical power loop. The gate turn-on waveforms are shown in FIG. 17B. As with the drain-source turn-on waveforms, there was nothing much to distinguish the three waveforms.

The results from these experiments demonstrate that flip-chip power device embodiments of the disclosed invention provide the ease of use and assembly of discrete devices. They do away with the cost and complexity associated with manufacturing wire bonded power modules, while providing even better performance.

Figure 18A:
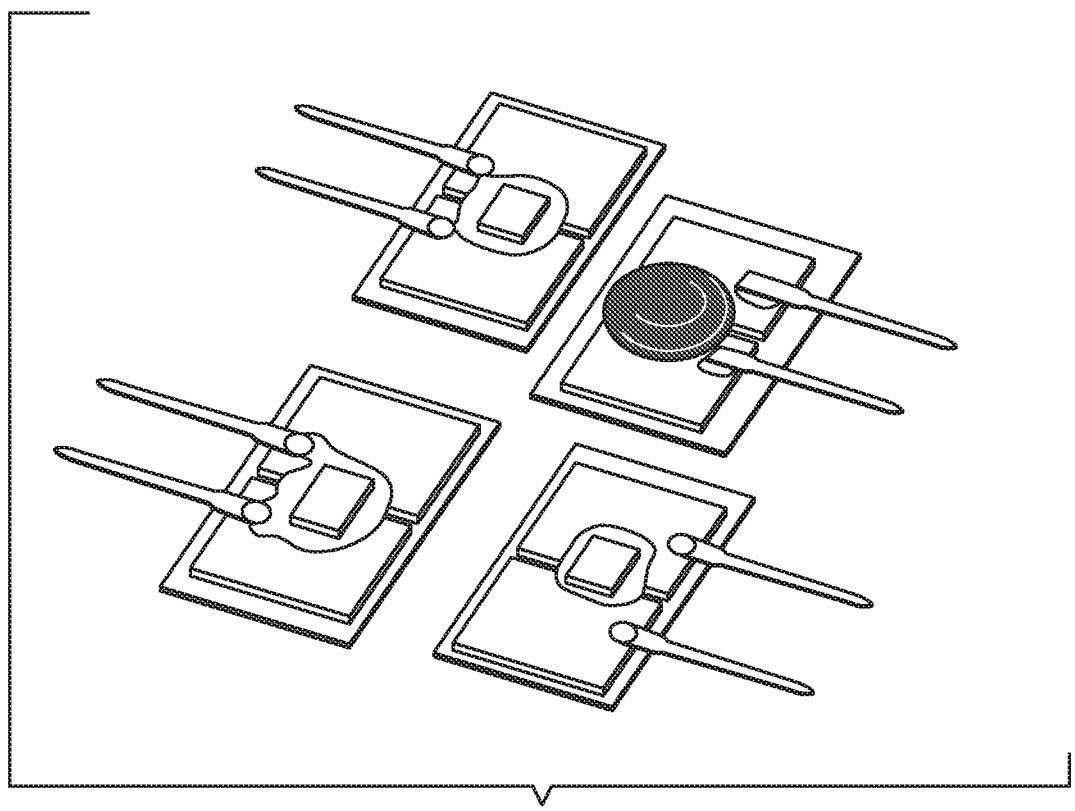
FIG. 18A shows flip-chip Schottky diodes and a wire bonded control sample.
Figure 18B:
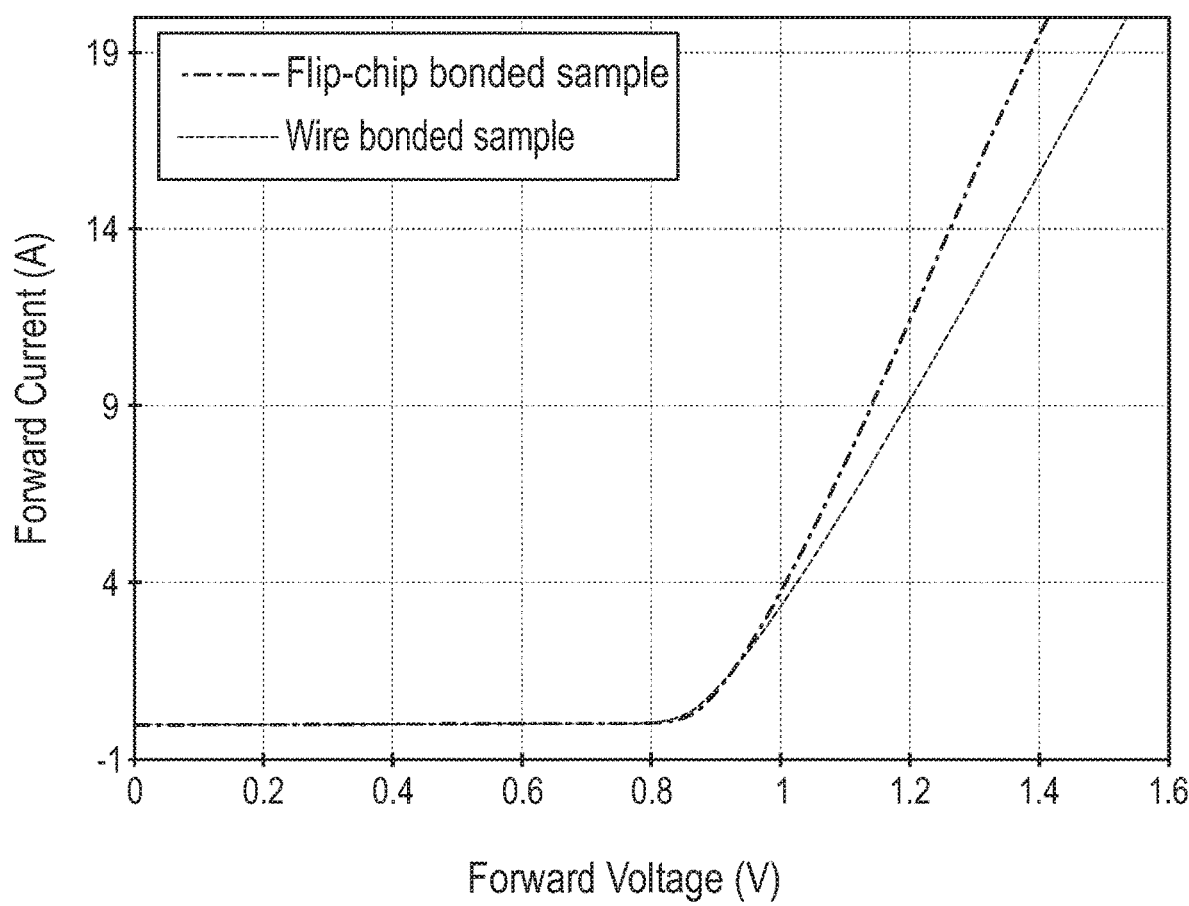
FIG. 18B is a graph of the forward I-V characteristics of the two modules.
Figure 18C:
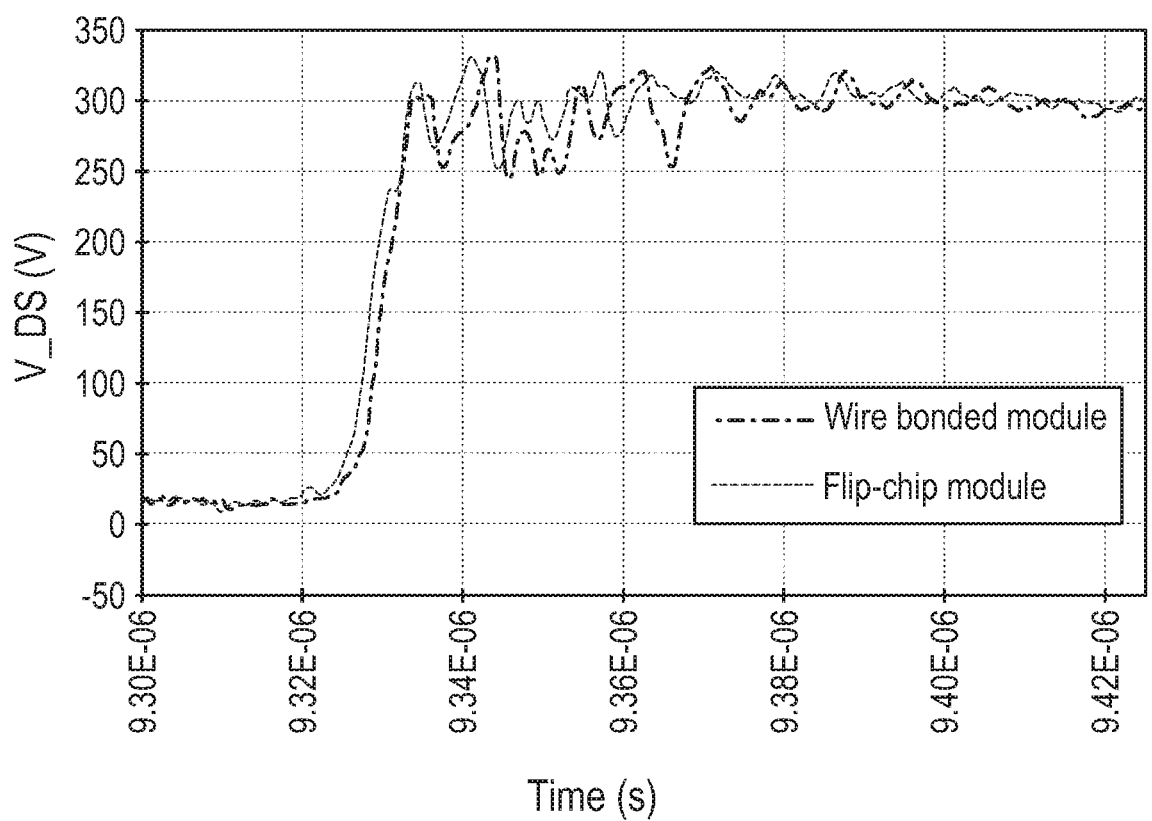
FIG. 18C shows the turn-off waveform comparison between the wire bonded and flip-chip module.

The disclosed flip-chip methods were also used to construct 650V-rated Schottky diode packages. To evaluate these devices on a Keysight curve tracer, they were engineered to fit a TO-247 form factor. An image of the samples is shown in FIG. 18A. One of the modules encapsulated in a black glob-top is a wire bonded sample for comparison. FIG. 18B shows the IV curve of the samples. It was observed that the on-state resistance of the wire bondless flip-chip sample was 24% lower than the wire bonded sample, despite being in a TO-247 package. This implies a 24% reduction in the conduction losses of the Schottky diode merely as a result of doing away with wire bonds in favor of the disclosed flip-chip methods. The turn-off waveforms of the two modules were also measured and are contrasted in FIG. 18C. As with the MOSFET modules, the time period of the ringing was measured using the oscilloscope cursors and the inductances were calculated. The calculations and results are shown in Table 2.

TABLE 2

Measured parasitic loop inductances of the two modules.

| Output capacitance of the MOSFET ($C_{oss}$) | Time period of ringing (s)($\Delta t$) | | Parasitic Loop Inductance (nH) = $(992 \times 10^9)\, C_{oss}$ | |
|---|---|---|---|---|
| | Wire-Bonded | Flip-chip | Wire-bonded | Flip-chip |
| 110e-12 | 9.2e-9 | 8.2e-9 | 19.51 | 15.5 |

Figure 18D:
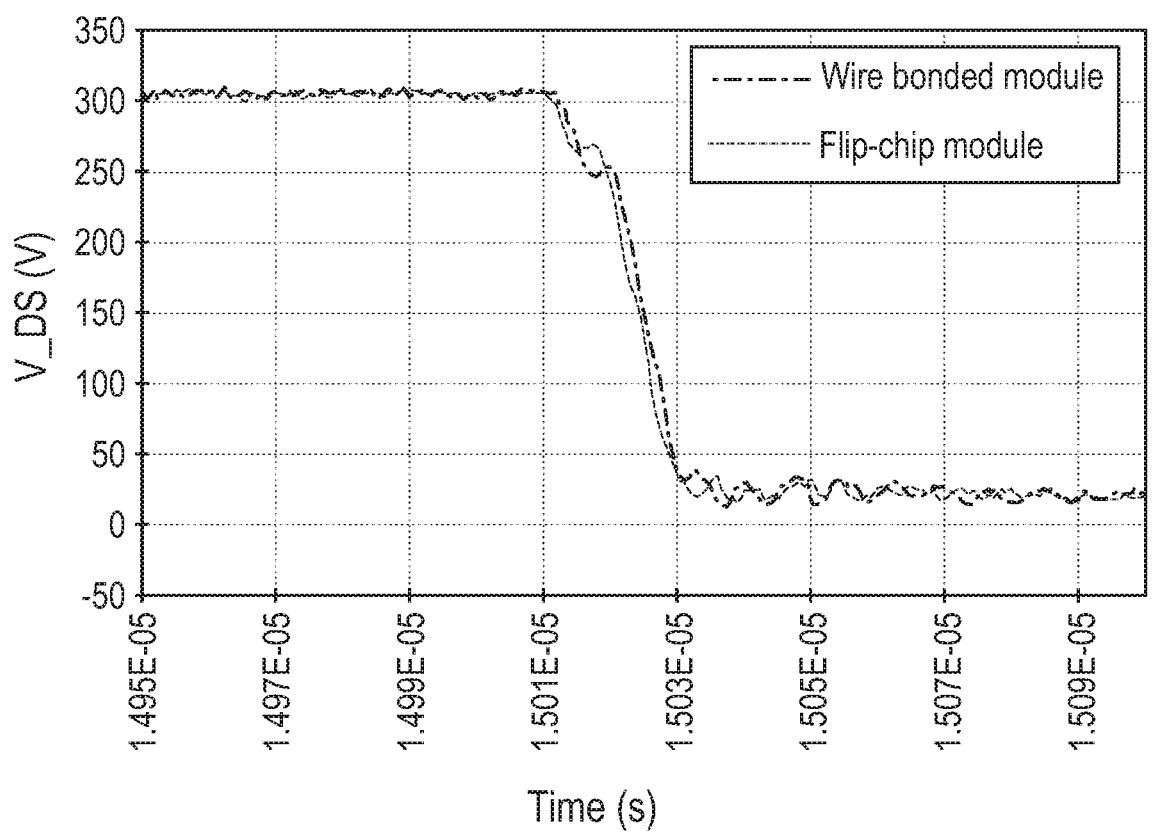
FIG. 18D shows the turn-on waveform comparison of the two modules.
Figure 18E:
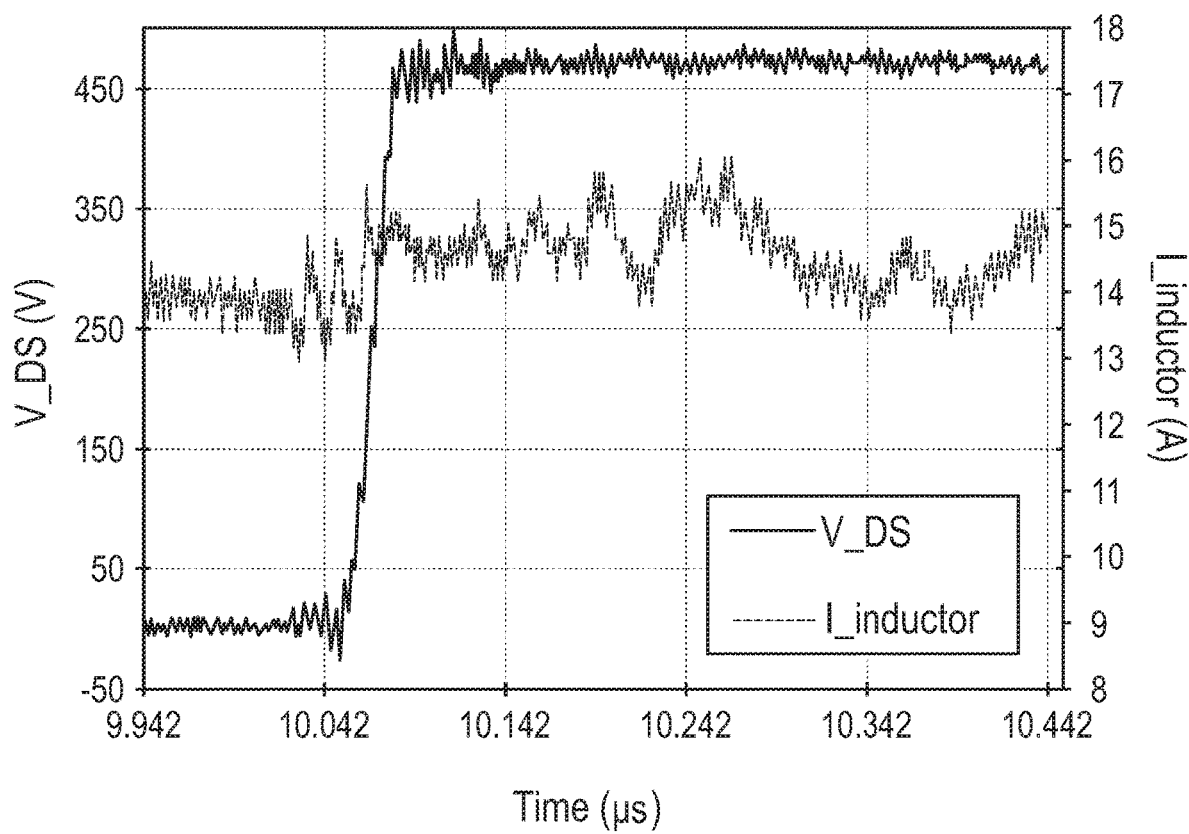
FIG. 18E shows the low-side diode voltage and inductor current plotted to demonstrate operation at 450 VDC, 15 A.

The overall loop inductance 20.5% lower despite the TO-247 package. FIG. 18D shows the turn-on waveforms for the two modules. FIG. 18E shows the voltage across the diode and the inductor current measured at a DC bus voltage of 450 V and 15 A.

Reference numerals used throughout the detailed description and the drawings correspond to the following elements:
- bare die power device 10
- bottom electrical contact 101
- top electrical contact 102
- bottom pad connector 11
- top surface second contact 103
- the lower level pad 104
- electrically conductive die-attach material 105
- trench 106
- top surface first contact 107
- gate pad 108
- source pads 109
- solder mask 12
- top pad solder spheres 13
- bottom pad solder spheres 14
- power devices 15
- metallic connector 16
- substrate 17
- underfill 18
- bare die converted to flip-chip power device 19
- electroless plating 21
- machining 22
- die attachment to bottom connector 23
- solder masking 24
- solder balls attached 25
- bonding to substrate 26
- mount sample 31
- clean 32
- remove oxide 33
- etch 34
- apply first zincate 35
- strip 36
- apply second zincate 37
- nickel plating 38
- gold plating 39
- mount die 41
- rinse 40
- argon clean 42a
- alkaline clean 42b
- rinse 42c
- etch 44a
- apply first zincate 44b
- strip 45
- etch 46a
- apply second zincate 46b
- rinse 47
- nickel plate 48

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A bare die converted to flip-chip power apparatus, the apparatus comprising:
   a bare die package with first side contacts at the first level and second side contacts at the second level, the bare die package including a silicon carbide power semiconductor device;
   a solderable plating applied to the second side contacts forming a first die pad;
   an electrically conductive mounting body defining a first mounting pad at a first level and a second mounting pad at the second level, the second mounting pad being solderable;
   the electrically conductive pad mounting body including an electrically conductive path from the first mounting pad to the second mounting pad;
   a die attach material electrically connecting the first side contacts to the first mounting pad.

2. The apparatus of claim 1, further comprising:
   electrically conductive pad mounting body extending from the bare die package to define a trench between the first mounting pad and the second mounting pad.

3. The apparatus of claim 1, further comprising:
   a solder mask is applied to the first mounting pad.

4. The apparatus of claim 1, further comprising:
   a solder mask applied to the second mounting pad.

5. The apparatus of claim 1, further comprising:
   the electrically conductive pad mounting body made out of metal.

* * * * *